United States Patent
Shigesawa et al.

(10) Patent No.: US 11,533,051 B2
(45) Date of Patent: Dec. 20, 2022

(54) SEMICONDUCTOR INTEGRATED CIRCUIT

(71) Applicants: Kabushiki Kaisha Toshiba, Tokyo (JP); Toshiba Electronic Devices & Storage Corporation, Tokyo (JP)

(72) Inventors: Eriko Shigesawa, Yokohama Kanagawa (JP); Akio Ogura, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/472,318

(22) Filed: Sep. 10, 2021

(65) Prior Publication Data
US 2022/0166428 A1    May 26, 2022

(30) Foreign Application Priority Data
Nov. 24, 2020   (JP) .............................. JP2020-194339

(51) Int. Cl.
    *H03K 17/687*   (2006.01)
(52) U.S. Cl.
    CPC ............................... *H03K 17/6872* (2013.01)
(58) Field of Classification Search
    CPC .................................................. H03K 17/6872
    See application file for complete search history.

(56) References Cited

U.S. PATENT DOCUMENTS

| | | | |
|---|---|---|---|
| 5,461,331 A | * | 10/1995 | Schorn ............. H03K 3/356113 327/210 |
| 5,541,546 A | * | 7/1996 | Okumura ....... H03K 19/018521 327/333 |
| 5,721,516 A | | 2/1998 | Furuchi |
| 6,388,487 B1 | | 5/2002 | Hirose |
| 2019/0229714 A1 | | 7/2019 | Saito |

FOREIGN PATENT DOCUMENTS

| | | |
|---|---|---|
| JP | S61-170129 A | 7/1986 |
| JP | H-01-181225 | 7/1989 |
| JP | H09-083344 A | 3/1997 |
| JP | 2000-349601 A | 12/2000 |
| JP | 2019-125995 A | 7/2019 |

* cited by examiner

*Primary Examiner* — Metasebia T Retebo
(74) *Attorney, Agent, or Firm* — Allen & Overy LLP

(57) ABSTRACT

According to one embodiment, a semiconductor integrated circuit includes the following configuration. A first transistor has a source and a gate coupled to first and second voltage nodes respectively. A second transistor has a source and a gate coupled to third and second voltage nodes respectively. A third transistor is coupled between the first and second transistors. A fourth transistor has a source coupled to the first voltage node and a gate coupled to a first output node between the second and third transistors. A fifth transistor has a source coupled to the third voltage node, a gate coupled to the gate of the fourth transistor and a drain coupled to a drain of the fourth transistor. A sixth transistor has a gate supplied with a voltage output from a second output node between the fourth and fifth transistors and a source coupled to the first voltage node.

19 Claims, 13 Drawing Sheets

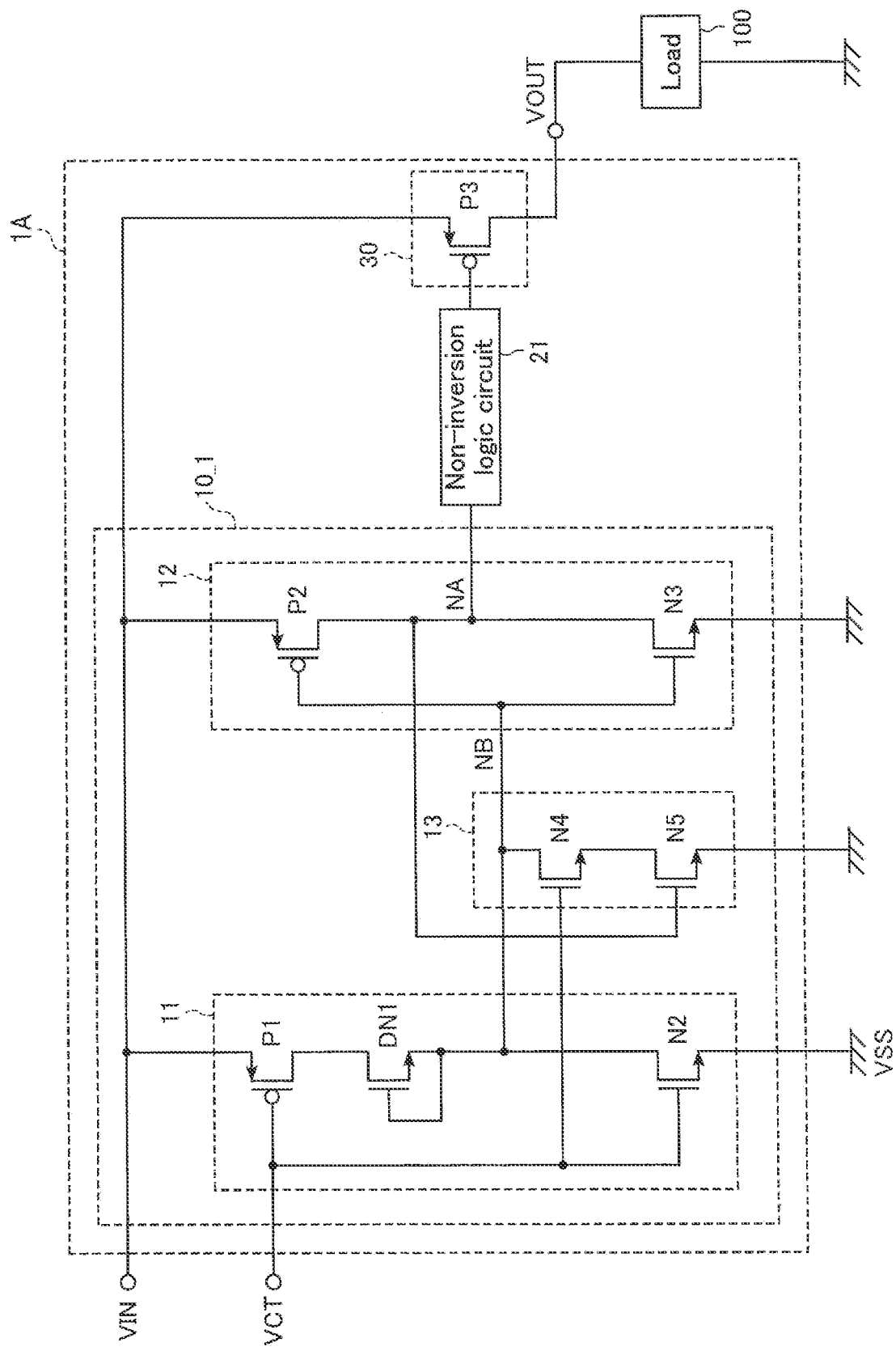
F I G. 8

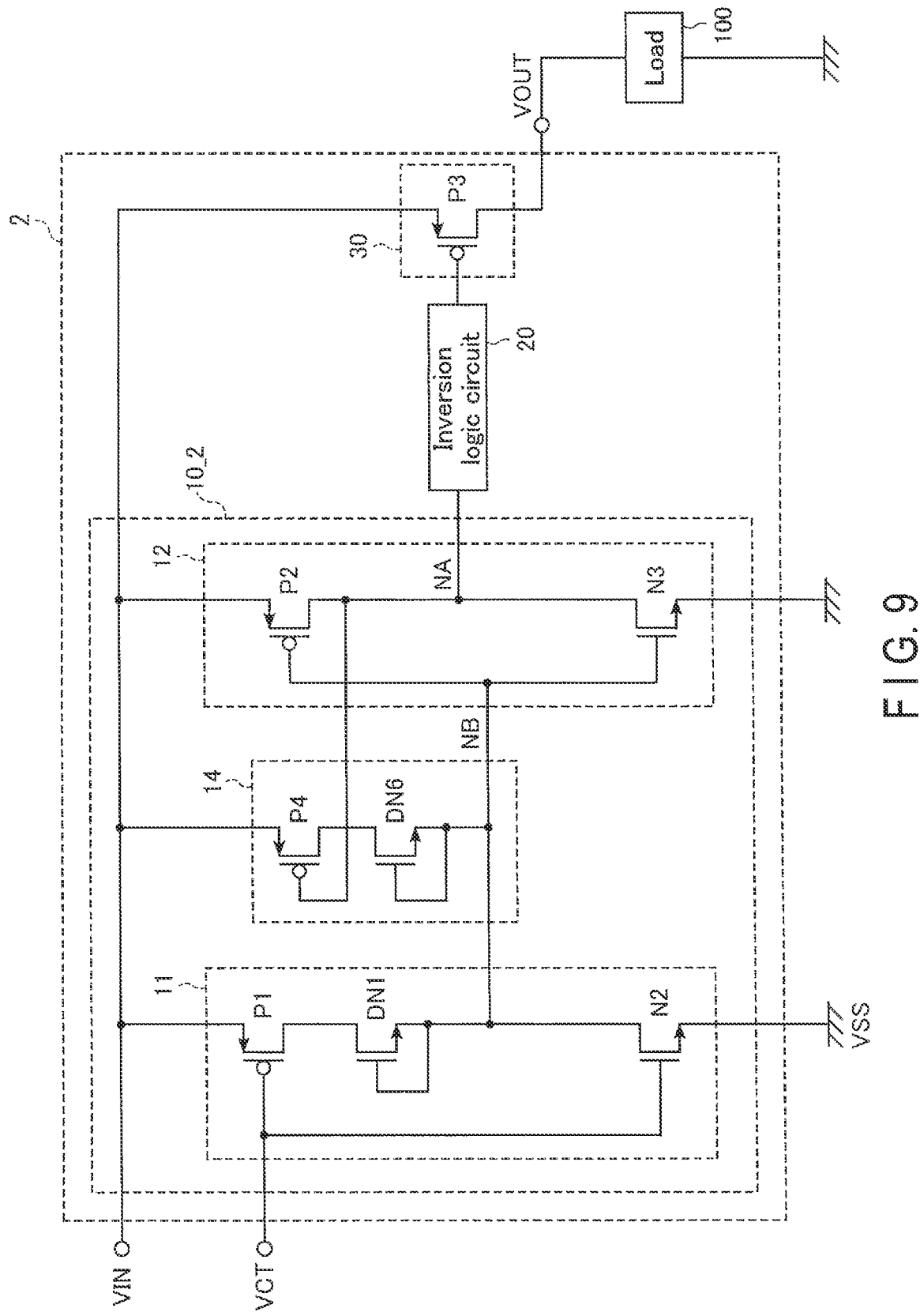
F I G. 9

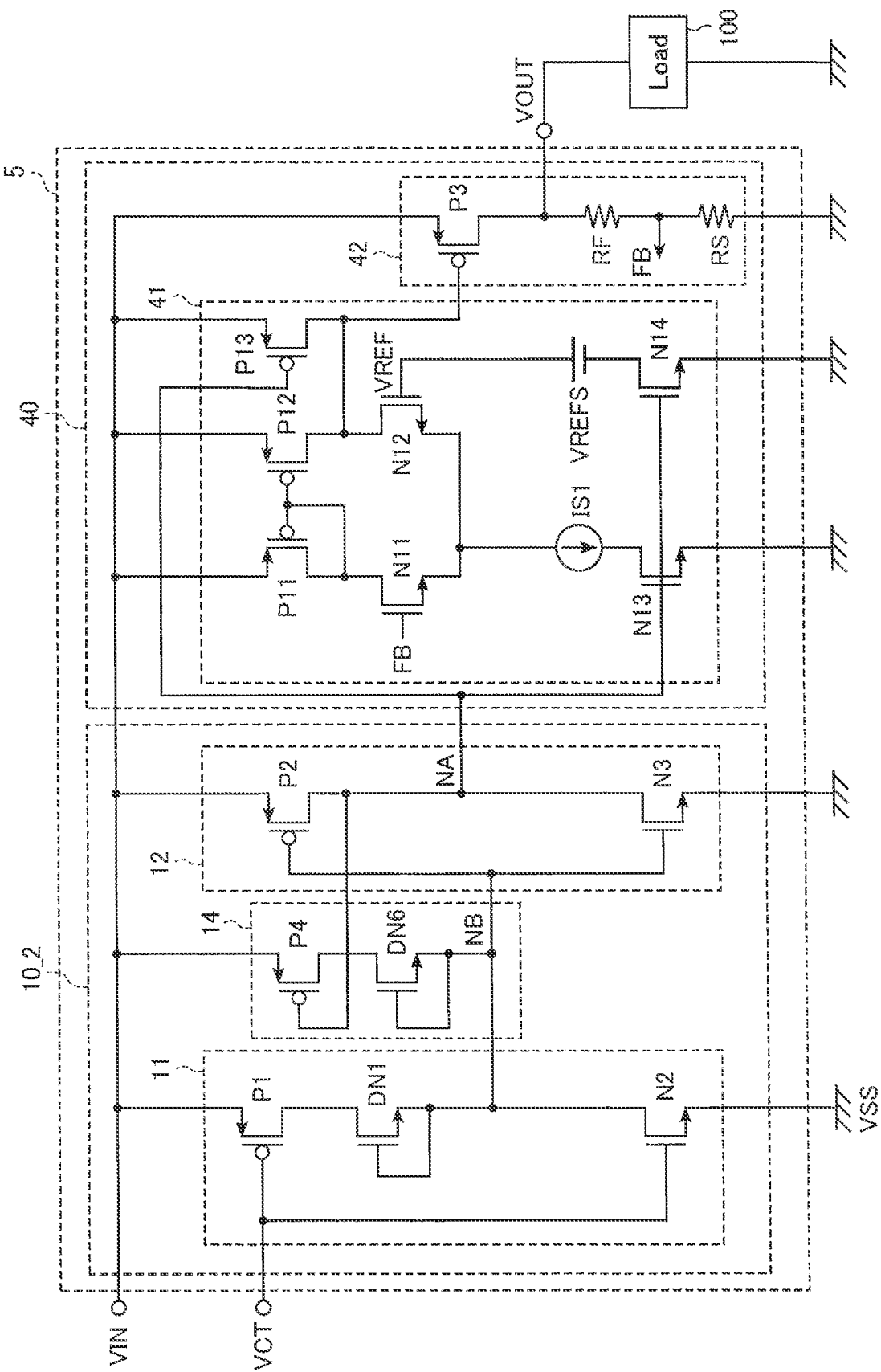
F I G. 12

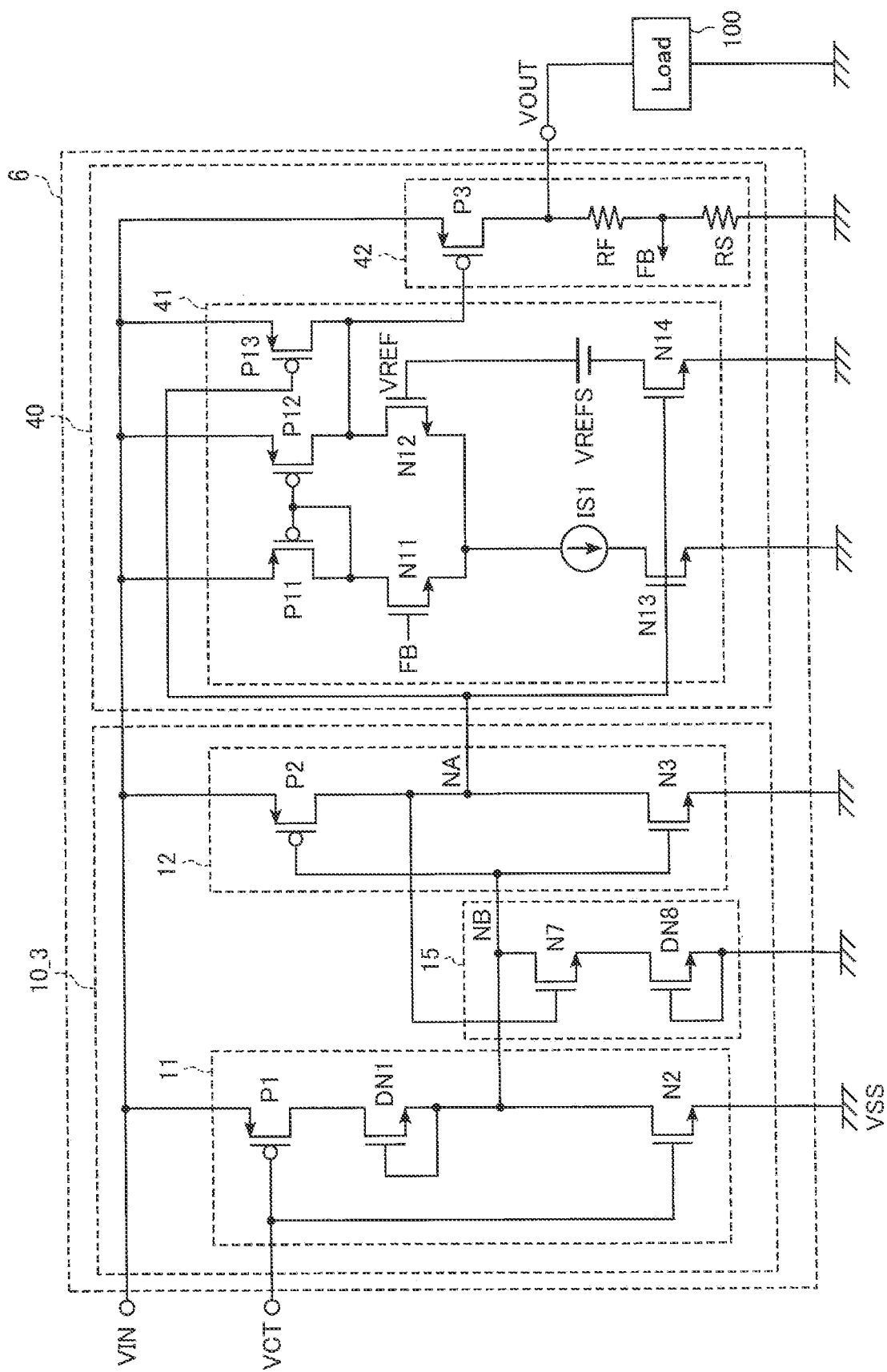
F I G. 13

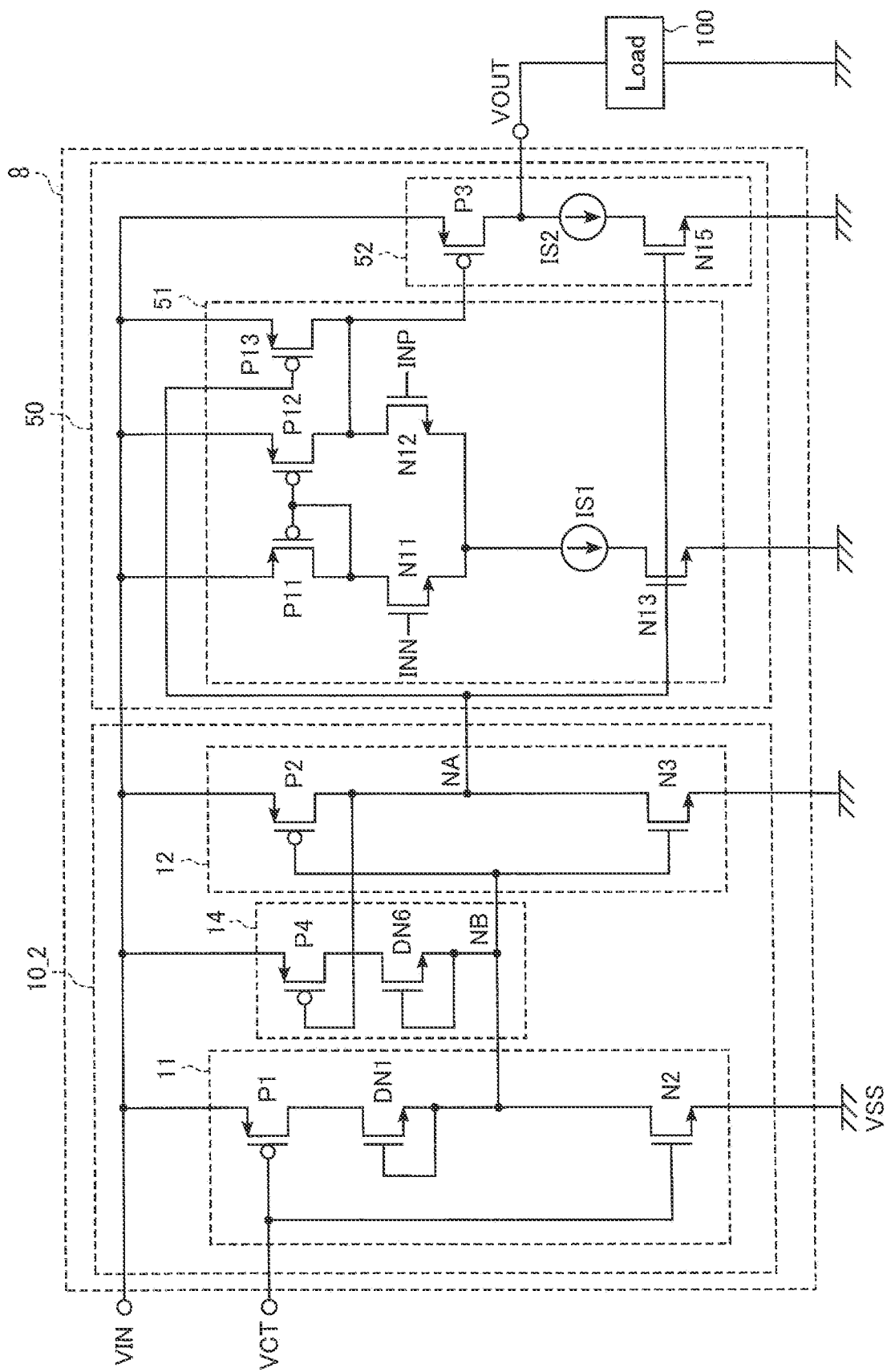
F I G. 15

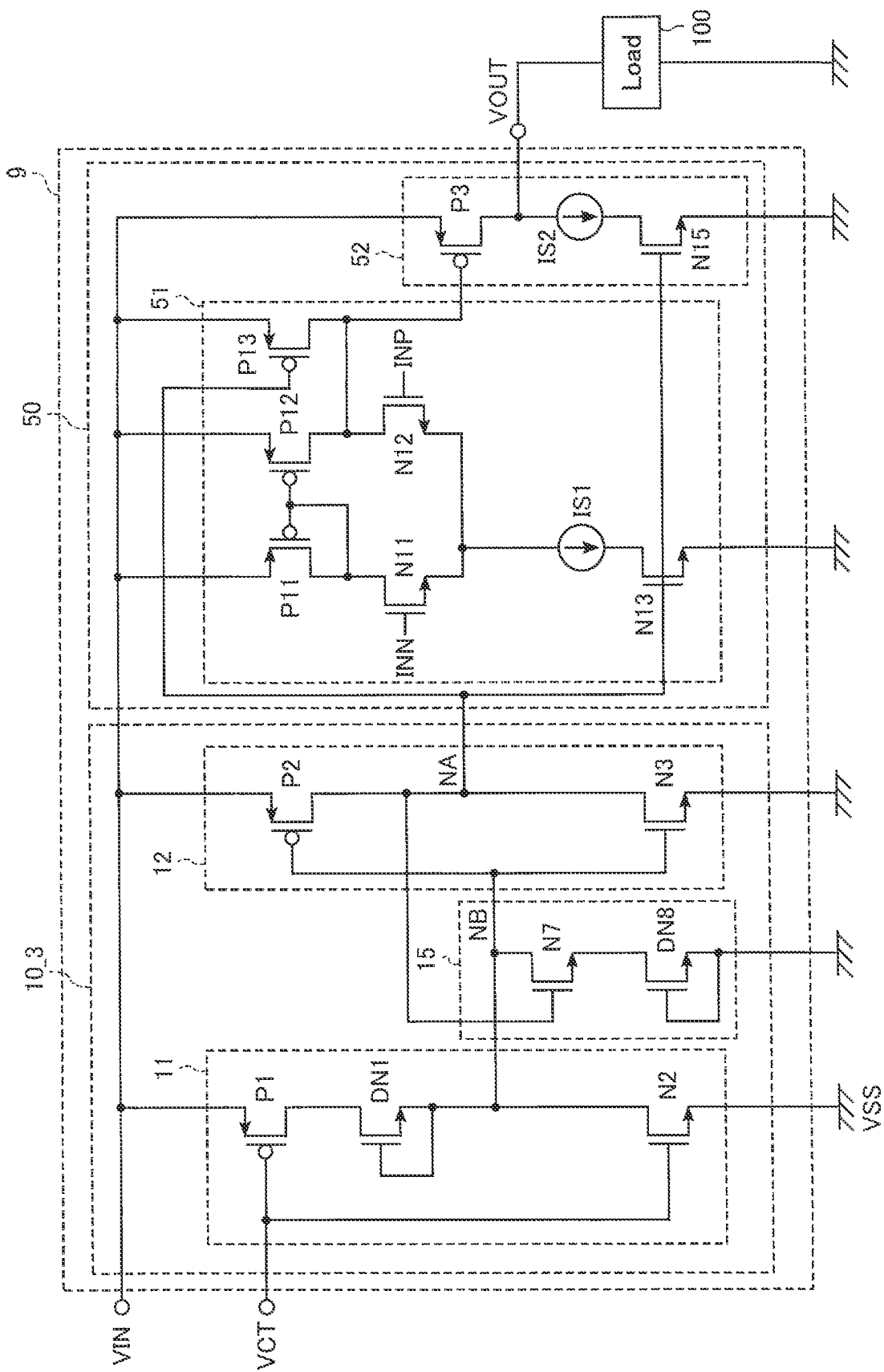
F I G. 16

SEMICONDUCTOR INTEGRATED CIRCUIT

CROSS-REFERENCE TO RELATED APPLICATIONS

This application is based upon and claims the benefit of priority from Japanese Patent Application No. 2020-194339, filed Nov. 24, 2020, the entire contents of which are incorporated herein by reference.

FIELD

Embodiments described herein relate generally to a semiconductor integrated circuit.

BACKGROUND

A semiconductor integrated circuit which supplies a voltage to a load or interrupts supplying of the voltage is known.

BRIEF DESCRIPTION OF THE DRAWINGS

FIG. 8 is a circuit diagram showing a configuration of a semiconductor integrated circuit according to a modification of the first embodiment.

FIG. 9 is a circuit diagram showing a configuration of a semiconductor integrated circuit according to a second embodiment.

FIG. 12 is a circuit diagram showing a configuration of a semiconductor integrated circuit according to a fifth embodiment.

FIG. 13 is a circuit diagram showing a configuration of a semiconductor integrated circuit according to a sixth embodiment.

FIG. 15 is a circuit diagram showing a configuration of a semiconductor integrated circuit according to an eighth embodiment.

FIG. 16 is a circuit diagram showing a configuration of a semiconductor integrated circuit according to a ninth embodiment.

DETAILED DESCRIPTION

Figure 1:
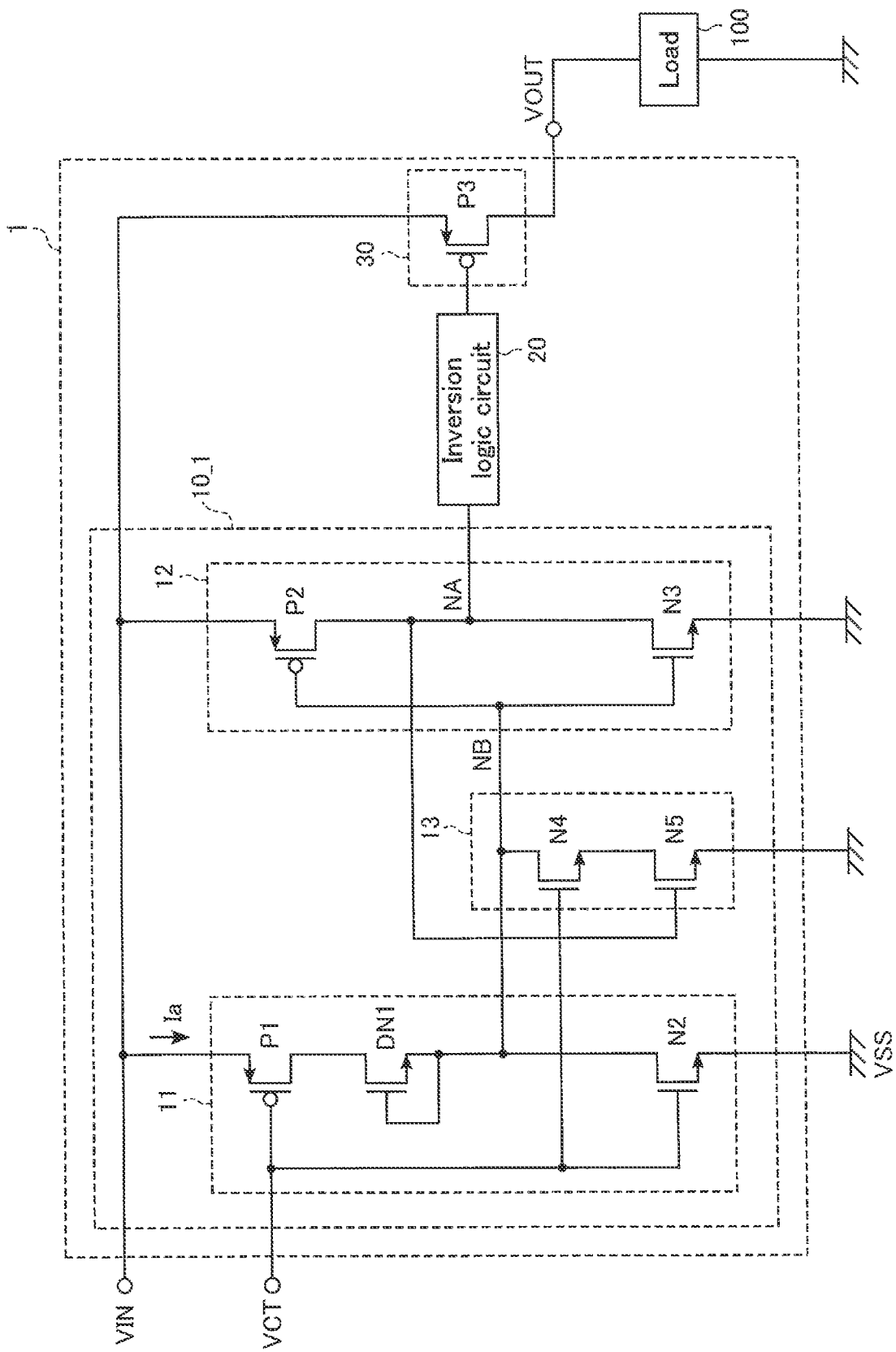
FIG. 1 is a circuit diagram showing a configuration of a semiconductor integrated circuit according to a first embodiment.

In general, according to one embodiment, a semiconductor integrated circuit includes a p-channel first transistor, a source of the first transistor being electrically coupled to a first voltage node to which a first voltage is supplied, a gate of the first transistor being electrically coupled to a second voltage node to which a second voltage is supplied; an n-channel second transistor, a source of the second transistor being electrically coupled to a third voltage node to which a third voltage is supplied, a gate of the second transistor being electrically coupled to the second voltage node; a depletion-type n-channel third transistor electrically coupled between a drain of the first transistor and a drain of the second transistor; a p-channel fourth transistor, a source of the fourth transistor being electrically coupled to the first voltage node, a gate of the fourth transistor being electrically coupled to a first output node located between the drain of the second transistor and a source of the third transistor; an n-channel fifth transistor, a source of the fifth transistor being electrically coupled to the third voltage node, a gate of the fifth transistor being electrically coupled to the gate of the fourth transistor, a drain of the fifth transistor being electrically coupled to a drain of the fourth transistor; and a p-channel sixth transistor, a gate of the sixth transistor being supplied with a voltage output from a second output node located between the drain of the fourth transistor and the drain of the fifth transistor, a source of the sixth transistor being electrically coupled to the first voltage node.

Hereinafter, embodiments will be described with reference to the accompanying drawings. In the description that follows, components having the same function and configuration will be assigned a common reference numeral. The embodiments to be described below merely illustrate a device and method that embody the technical idea, and do not intend to specify the material, shape, structure, arrangement, etc. of the components.

1. First Embodiment

A semiconductor integrated circuit according to a first embodiment will be described below. The semiconductor integrated circuit according to the first embodiment includes a load switch. The load switch is a circuit that supplies a power-supply voltage to a load such as an electronic circuit, or interrupts supplying of the power-supply voltage.

1.1 Configuration of First Embodiment

FIG. 1 is a circuit diagram showing a configuration of a semiconductor integrated circuit 1 according to the first embodiment. The semiconductor integrated circuit 1 includes a load switch that supplies an output voltage VOUT (e.g., input voltage VIN) to a load 100 arranged at the output stage of the semiconductor integrated circuit 1, or interrupts supplying of the output voltage VOUT.

The semiconductor integrated circuit 1 includes a control circuit 10_1, an inversion logic circuit 20, and a load switch 30. The control circuit 10_1 controls the operation of the load switch 30 according to a control voltage VCT. The inversion logic circuit 20 outputs a voltage obtained by inverting an output voltage of the control circuit 10_1. The load switch 30 is a circuit that outputs an input voltage VIN or interrupts the input voltage VIN.

The control circuit 10_1 and the load switch 30 will be described in detail below.

The control circuit 10_1 includes an input circuit 11, an inverter 12, and a hysteresis circuit (or a chattering prevention circuit) 13.

The input circuit 11 outputs a voltage obtained by inverting the control voltage VCT. The input circuit 11 includes a p-channel MOS field-effect transistor P1, a depletion-type n-channel MOS field-effect transistor DN1, and an n-channel MOS field-effect transistor N2. Hereinafter, a p-channel MOS field effect transistor will be referred to as a "pMOS transistor", and an n-channel MOS field-effect transistor is referred to as an "nMOS transistor". A MOS transistor that is not specified as a depletion type is an enhancement type.

The pMOS transistor P1 and the nMOS transistor N2 included in the input circuit 11 configure an inverter. The nMOS transistor DN1 is coupled between the pMOS transistor P1 and the nMOS transistor N2.

The inverter 12 outputs a voltage obtained by inverting the output voltage of the input circuit 11. The inverter 12 includes a pMOS transistor P2 and an nMOS transistor N3.

The hysteresis circuit 13 reduces or prevents vibration of a voltage output from the input circuit 11. That is, the hysteresis circuit 13 stabilizes the output voltage of the input circuit 11. The hysteresis circuit 13 includes nMOS transistors N4 and N5.

The load switch 30 includes a pMOS transistor P3. The load switch 30 outputs the input voltage VIN as the output voltage VOUT according to a voltage output from the inversion logic circuit 20, or stops outputting the input voltage VIN. In other words, the load switch 30 supplies the output voltage VOUT (input voltage VIN) to the load 100 or interrupts supplying of the output voltage VOUT, based on the output voltage of the inversion logic circuit 20.

The size (channel width W and channel length L) of the pMOS transistor P3 is determined according to the product specifications (e.g., on-resistance and current operation conditions). The on-resistance refers to resistance characteristics between the source and the drain of the pMOS transistor P3 when the pMOS transistor P3 is in the on state. It is required that the pMOS transistor P3 have a low on-resistance and a characteristic to let a large current flow therethrough. Thus, the pMOS transistor P3 has a large channel width W, compared to the pMOS transistors P1 and P2.

Circuit coupling of the semiconductor integrated circuit 1 will be described below.

The source of the pMOS transistor P1 is coupled to a node to which the input voltage VIN is supplied. That is, the input voltage VIN is supplied to the source of the pMOS transistor P1. The gate of the pMOS transistor P1 and the gate of the nMOS transistor N2 are coupled to a node to which the control voltage VCT is input. That is, the control voltage VCT is supplied to the gate of the pMOS transistor P1 and the gate of the nMOS transistor N2. Furthermore, the drain of the pMOS transistor P1 is coupled to the drain of the nMOS transistor DN1.

The source and the gate of the nMOS transistor DN1 are coupled to the drain of the nMOS transistor N2. The backgate of the nMOS transistor DN1 is coupled to the source of the nMOS transistor DN1. The nMOS transistor DN1 is set to have a ratio (W/L) at which a very small current source is achieved. In the nMOS transistor DN1, a channel length L is greater than a channel width W.

The backgate of the nMOS transistor DN1 may be coupled to the source of the nMOS transistor DN1 either directly or via a resistance. The backgate of the nMOS transistor DN1 may also be coupled to a node to which a reference voltage VSS is supplied. Also, for example, an n-type region insulated from a p-type semiconductor substrate is provided within the p-type semiconductor substrate, and the n-type region is used to make the backgate of the nMOS transistor DN1 electrically coupled to the source. This allows the potential of the backgate to follow the potential of the source.

The source of the nMOS transistor N2 is coupled to the node to which the reference voltage VSS is supplied. That is, the reference voltage VSS is supplied to the source of the nMOS transistor N2. A gain of the nMOS transistor N2 is greater than a gain of the nMOS transistor DN1.

The source of the nMOS transistor DN1 is also coupled to the drain of the nMOS transistor N4, the gate of the pMOS transistor P2, and the gate of the nMOS transistor N3. The gate of the nMOS transistor N4 is coupled to the node to which the control voltage VCT is input. That is, the control voltage VCT is supplied to the gate of the nMOS transistor N4. The source of the nMOS transistor N4 is coupled to the drain of the nMOS transistor N5. The gate of the nMOS transistor N5 is coupled to the drain of the pMOS transistor P2 and the drain of the nMOS transistor N3. The source of the nMOS transistor N5 is coupled to the node to which the reference voltage VSS is supplied. That is, the reference voltage VSS is supplied to the source of the nMOS transistor N5.

The source of the pMOS transistor P2 is coupled to the node to which the input voltage VIN is supplied. That is, the input voltage VIN is supplied to the source of the pMOS transistor P2. The gate of the pMOS transistor P2 is coupled to the gate of the nMOS transistor N3. The drain of the pMOS transistor P2 is coupled to the drain of the nMOS transistor N3. The source of the nMOS transistor N3 is coupled to the node to which the reference voltage VSS is supplied. That is, the reference voltage VSS is supplied to the source of the nMOS transistor N3.

The drain of the pMOS transistor P2 and the drain of the nMOS transistor N3 (output terminal of the inverter 12) are coupled to the input terminal of the inversion logic circuit 20. The output terminal of the inversion logic circuit 20 is coupled to the gate of the pMOS transistor P3. The inversion logic circuit 20 may have the function of reducing or preventing a sudden change of the pMOS transistor P3 to an on or off state by restricting the speed of change of the output voltage, in addition to the function of inverting the logic. The source of the pMOS transistor P3 is coupled to the node to which the input voltage VIN is supplied. That is, the input voltage VIN is supplied to the source of the pMOS transistor P3. Furthermore, the drain of the pMOS transistor P3 is coupled to a load 100 arranged at the output stage of the pMOS transistor P3. The load 100 is provided outside the semiconductor integrated circuit 1. The pMOS transistor P3 supplies an output voltage VOUT to the load 100 or stops supplying the output voltage VOUT.

The output terminal of the inverter 12 configured of the pMOS transistor P2 and the nMOS transistor N3 is referred to as a "node NA". Also, the output terminal of the input circuit 11 configured of the pMOS transistor P1, the nMOS transistor DN1, and the nMOS transistor N2 will be referred to as a "node NB".

The input voltage VIN or the control voltage VCT is a positive voltage with reference to the reference voltage VSS. The input voltage VIN is, for example, 3.6 V. The control voltage VCT is a voltage higher than the input voltage VIN, or a voltage equal to or lower than the input voltage VIN, and is, for example, 3.6 V or 1.8 V. The reference voltage VSS is, for example, a ground potential or 0 V.

1.2 Operation of First Embodiment

An operation of the semiconductor integrated circuit 1 according to the first embodiment will be described below. It is assumed that an input voltage VIN that allows all the MOS transistors to stably operate is supplied to the semiconductor integrated circuit 1.

(1) When Control Voltage VCT is "L"

Assuming, for example, that the input voltage VIN is 3.6 V (hereinafter referred to as "H"), and the control voltage VCT is the reference voltage VSS (hereinafter referred to as "L"), the operation is as follows.

When the control voltage VCT is "L", the pMOS transistor P1 is brought to the on state, and the nMOS transistors N2 and N4 are brought to the off state. Thereby, the node NB is brought to "H" (e.g., 3.6 V). Since the nMOS transistor N2 is in the off state, a current does not flow through a line in which the pMOS transistor P1, the nMOS transistor DN1, and the nMOS transistor N2 are coupled in series. That is, a through current that flows from the node of the input voltage VIN to the node of the reference voltage VSS via the input circuit 11 is not generated.

When the node NB is brought to "H", the pMOS transistor P2 is brought to the off state, and the nMOS transistor N3 is brought to the on state. Thereby, the node NA is brought to "L". At this time, since the pMOS transistor P2 is in the off state, a current does not flow through a line in which the pMOS transistor P2 and the nMOS transistor N3 are coupled in series. That is, a through current that flows from the node of the input voltage VIN to the node of the reference voltage VSS via the inverter 12 is not generated.

When the node NA is brought to "L", the inversion logic circuit 20 inverts the received "L", and outputs "H" to the gate of the pMOS transistor P3. When "H" is input to the gate, the pMOS transistor P3 is brought to the off state. An input voltage VIN is supplied to the source of the pMOS transistor P3. Since the pMOS transistor P3 is in the off state, an output of the input voltage VIN supplied to the source is interrupted. That is, the pMOS transistor P3 stops outputting the input voltage VIN as the output voltage VOUT.

(2) When Control Voltage VCT is "H"

When, for example, the input voltage VIN is 3.6 V and the control voltage VCT is 3.6 V or 1.8 V (hereinafter referred to as "H"), which is half the voltage of the input voltage VIN, the operation is as follows.

When the control voltage VCT is "H" (e.g., 3.6 V or 1.8 V), the pMOS transistor P1 is brought to the off state, and the nMOS transistors N2 and N4 are brought to the on state. Thereby, the node NB is brought to "L". Since the pMOS transistor P1 is in the off state, a current does not flow through a line in which the pMOS transistor P1, the nMOS transistor DN1, and the nMOS transistor N2 are coupled in series. That is, a through current that flows from the node of the input voltage VIN to the node of the reference voltage VSS via the input circuit 11 is not generated.

When the node NB is brought to "L", the pMOS transistor P2 is brought to the on state, and the nMOS transistor N3 is brought to the off state. Thereby, the node NA is brought to "H". At this time, since the nMOS transistor N3 is in the off state, a current does not flow through a line in which the pMOS transistor P2 and the nMOS transistor N3 are coupled in series. That is, a through current that flows from the node of the input voltage VIN to the node of the reference voltage VSS via the inverter 12 is not generated.

When the node NA is brought to "H", the inversion logic circuit 20 inverts the received "H", and outputs "L" to the gate of the pMOS transistor P3. When "L" is input to the gate, the pMOS transistor P3 is brought to the on state. The pMOS transistor P3, which is in the on state, outputs the input voltage VIN supplied to the source. That is, the pMOS transistor P3 outputs the input voltage VIN as the output voltage VOUT.

(3) When Control Voltage VCT Transitions from "L" to "H", or from "H" to "L"

When, for example, "H" (e.g., 1.8 V) is input as the control voltage VCT while the input voltage VIN of, for example, 3.6 V is supplied, the nMOS transistor N2 is brought to the on state and the pMOS transistor P3 is also brought to the on state. When "L" (e.g., VSS) is input as the control voltage VCT, the nMOS transistor N2 is brought to the off state, and the pMOS transistor P3 is brought to the off state.

However, when the control voltage VCT in the vicinity of a boundary at which the nMOS transistor N2 is brought to the on or off state (e.g., a threshold voltage of the nMOS transistor N2) is input, the pMOS transistor P3 may repeatedly switch between the on state and the off state. Hereinafter, a phenomenon in which the MOS transistor repeatedly switches between the on state and the off state, causing its output voltage to vibrate, will be referred to as "chattering".

To prevent occurrence of the chattering, the semiconductor integrated circuit 1 of the first embodiment includes a hysteresis circuit 13. The hysteresis circuit 13 includes nMOS transistors N4 and N5. The nMOS transistors N4 and N5 detect input voltages of the input circuit 11 and the inversion logic circuit 20 respectively, and are brought to the on or off state.

Figure 2:
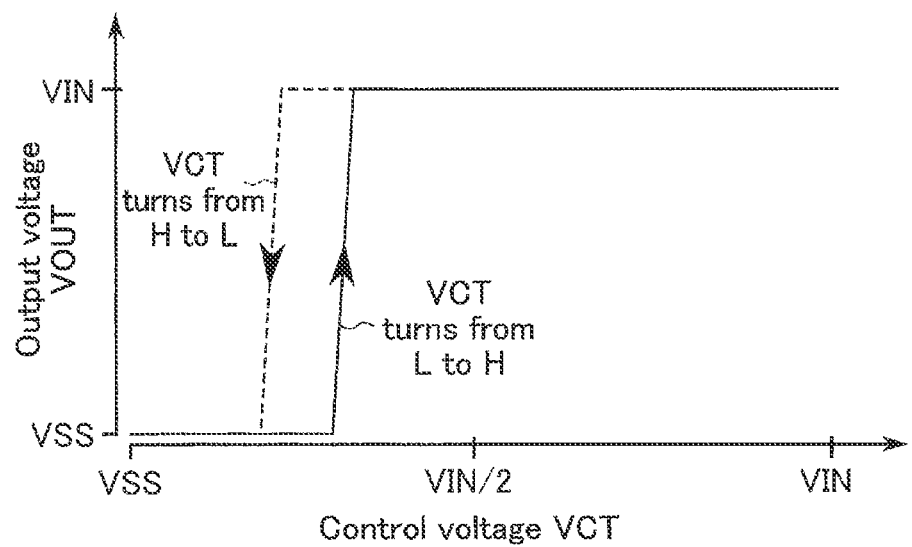
FIG. 2 shows an output voltage when a control voltage increases or decreases according to the first embodiment.

FIG. 2 shows a change of an output voltage VOUT in accordance with an increase or decrease of the control voltage VCT. When the pMOS transistor P3 is brought to the on state, the output voltage VOUT transitions to the input voltage VIN, and when the pMOS transistor P3 is brought to the off state, the output voltage VOUT transitions to the reference voltage VSS.

With the hysteresis circuit 13 provided, as shown in FIG. 2, the control voltage VCT when the output voltage VOUT transitions from the reference voltage VSS to the input voltage VIN and the control voltage VCT when the output voltage VOUT transitions from the input voltage VIN to the reference voltage VSS can be set to different voltage values.

Thereby, the pMOS transistor P3 has operation characteristics of not easily transitioning to the on state from the off state, and not easily transitioning to the off state from the on state, in accordance with an increase or decrease of the control voltage VCT. As a result, even when a control voltage VCT in the vicinity of a boundary at which the nMOS transistor N2 is brought to the on or off state is input, it is possible to prevent chattering from occurring in the output voltage VOUT, thus stabilizing the voltage value of the output voltage VOUT.

Figure 3:
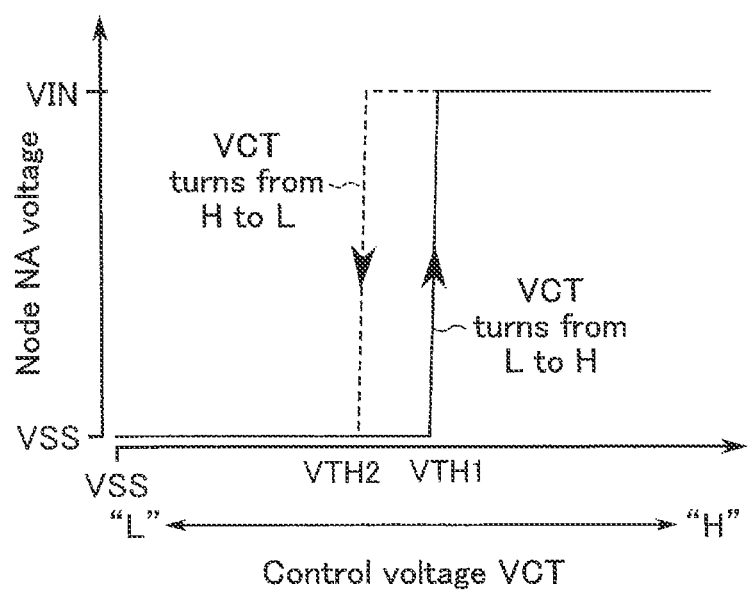
FIG. 3 shows a voltage of a node NA when the control voltage increases or decreases according to the first embodiment.

An operation of the hysteresis circuit 13 provided at an output terminal (node NB) of the input circuit 11 will be described with reference to FIG. 3. For ease of explanation, the resistances of the pMOS transistor P1 and the nMOS transistors DN1 and N2 are respectively referred to as "RP1", "RDN1", and "RN2". Similarly, the resistances of the nMOS transistors N4 and N5 are respectively referred to as "RN4" and "RN5". The notation "(RN4+RN5)" indicates a combined resistance of RN4 and RN5 when the nMOS transistor N4 and the nMOS transistor N5 are coupled in series. The notation "(RN2//(RN4+RN5))" indicates a combined resistance of RN2, RN4, and RN5 when the nMOS transistor N2 and the nMOS transistors N4 and N5 are coupled in parallel. FIG. 3 indicates a voltage at the node NA (hereinafter referred to as a "node NA voltage") when the control voltage VCT increases, and the node NA voltage when the control voltage VCT decreases.

When the control voltage VCT gradually increases from "L" and reaches a voltage VTH1 at which RN2 is lower than (RP1+RDN1), the output voltage of the input circuit 11 (hereinafter referred to as "node NB voltage") is brought to "L", and the node NA voltage is brought to "H". At this time, in the input circuit 11, the output voltage of the input circuit 11, namely, the node NB voltage is determined according to which of the resistances (RP1+RDN1) and RN2 is smaller (or greater). When the node NB voltage is brought to "L" and the node NA voltage is brought to "H", the nMOS transistors N4 and N5 are brought to the on state, resulting in a decrease in (RN2//(RN4+RN5)).

On the other hand, when the control voltage VCT gradually decreases from "H" and reaches a voltage VTH2 at which (RN2//(RN4+RN5)) is higher than (RP1+RDN1), the output voltage of the input circuit 11, namely, the node NB voltage is brought to "H", and the node NA voltage is brought to "L". When the node NA voltage is brought to "L", the nMOS transistors N4 and N5 are brought to the off state, resulting in an increase in (RN2//(RN4+RN5)).

By thus causing the nMOS transistors N4 and N5 that configure the hysteresis circuit 13 to transition to the on state or the off state, the control voltage VCT when the node NB voltage falls from "H" to "L" and the control voltage VCT when the node NB voltage rises from "L" to "H" are set to different voltage values. The node NA voltage is an inverted voltage of the node NB voltage. Thus, as shown in FIG. 3, the control voltage VCT (voltage VTH1) when the node NA voltage rises from "L" to "H" and the control voltage VCT (voltage VTH2) when the node NA voltage falls from "H" to "L" are set to different voltage values. Specifically, the control voltage VCT when the node NA voltage transitions from "H" to "L" is shifted toward the "L" side.

The larger the ratio (W/L) of channel width W and channel length L of nMOS transistor N4 than the ratio (W/L) of nMOS transistor N2, the larger the hysteresis width, namely, the difference between the voltage VTH1 and the voltage VTH2. The threshold voltage of the nMOS transistor N2 may be set to be higher than the threshold voltage of the nMOS transistor N4. This also increases the hysteresis width.

The nMOS transistor N5 has a function as a switch with respect to a current that flows from the node NB to the node of the reference voltage VSS via the nMOS transistor N4. The nMOS transistor N5 has a ratio (W/L) that allows a larger current than a current that the nMOS transistor DN1 can carry. That is, the nMOS transistor N5 is capable of driving a larger current than the nMOS transistor DN1. If the nMOS transistor N5 is capable of driving a larger current than the nMOS transistor DN1, there will be no effects on the voltage VTH1 and the voltage VTH2.

According to the first embodiment with the above-described configuration, by providing the hysteresis circuit 13, even when the control voltage VCT in the vicinity of a threshold voltage of the nMOS transistor N2 is input, it is possible to prevent chattering from occurring in the node NA voltage. It is thereby possible to prevent chattering from occurring in the output of the inversion logic circuit 20, thus stabilizing the voltage value of the output voltage VOUT.

In the above-described operation, when "H" is input as the control voltage VCT, the input voltage VIN is output as the output voltage VOUT, and when "L" is input as the control voltage VCT, an output of the input voltage VIN as an output voltage VOUT is interrupted.

However, a configuration may be adopted in which, when "H" is input as the control voltage VCT, the output of the input voltage VIN as the output voltage VOUT is interrupted, and when "L" is input as the control voltage VCT, the input voltage VIN is output as the output voltage VOUT.

1.3 Advantageous Effects of First Embodiment

According to the first embodiment, it is possible to provide the semiconductor integrated circuit including the load switch equipped with the through current prevention function and capable of reducing power consumption.

Hereinafter, two comparative examples (Comparative Examples 1 and 2) of the first embodiment will be described, and then advantageous effects of the first embodiment will be described.

Figure 4:
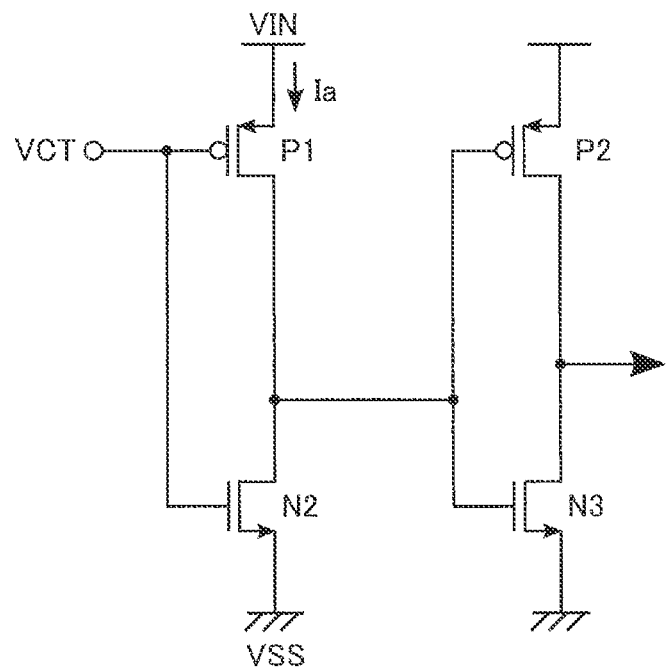
FIG. 4 is a circuit diagram showing a configuration of Comparative Example 1.
Figure 5:
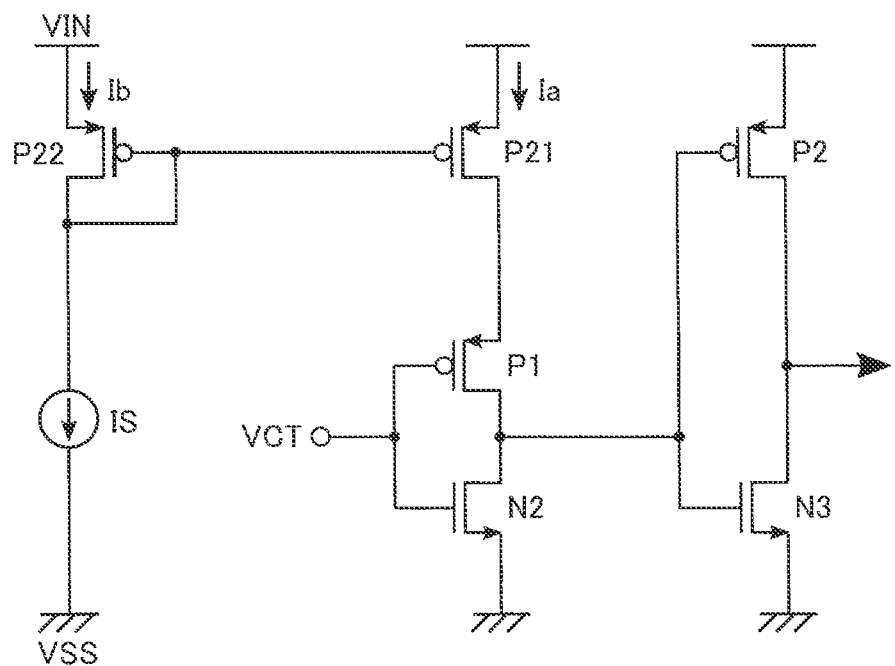
FIG. 5 is a circuit diagram showing a configuration of Comparative Example 2.

For example, in Comparative Example 1 shown in FIG. 4, a through current Ia flowing from the node of the input voltage VIN to the node of the reference voltage VSS via the pMOS transistor P1 and the nMOS transistor N2 may be generated. The through current Ia may be a cause of malfunction or damage of the element. To prevent the through current Ia, in Comparative Example 2 shown in FIG. 5, a pMOS transistor P21 is coupled between the node of the input voltage VIN and the pMOS transistor P1. Thereby, the through current Ia is suppressed.

In Comparative Example 2, the pMOS transistors P21 and P22 and the constant current source IS configure a current mirror. Thus, regardless of whether the pMOS transistor P1 and the nMOS transistor N2 that configure the inverter are in the on state or the off state, the pMOS transistor P22 and the constant current source IS constantly keep letting a current Ib flow. The current Ib is represented as a consumption current in the semiconductor integrated circuit.

Thus, in the first embodiment, a depletion-type nMOS transistor DN1 is coupled between the pMOS transistor P1 and the nMOS transistor N2. Thereby, in the semiconductor integrated circuit 1 of the first embodiment, it is possible to suppress a through current that flows from the node of the input voltage VIN to the node of the reference voltage VSS via the pMOS transistor P1 and the nMOS transistors DN1 and N2, and to reduce the power consumption.

Moreover, according to the first embodiment, a hysteresis circuit 13 is coupled to an output terminal (node NB) of the input circuit 11. The hysteresis circuit 13 reduces chattering of the voltage (voltage of the node NB) output from the input circuit 11. It is thereby possible to stabilize the output from the inverter 12 and the inversion logic circuit 20 which operate in receipt of a voltage of the node NB. As a result, it is possible to prevent chattering from occurring in the output voltage VOUT of the load switch 30, thus stabilizing the output voltage VOUT.

Advantageous effects of the first embodiment will be described. The semiconductor integrated circuit 1 of the first embodiment produces mainly the four advantageous effects to be described below.

The first advantage is that the through current can be prevented. In the first embodiment, it is possible to suppress the through current Ia that is generated in the inverter (the pMOS transistor P1 and the nMOS transistor N2) shown in Comparative Example 1. That is, in the first embodiment, it is possible to prevent the through current Ia from occurring in the input circuit 11. The nMOS transistor DN1 has a function of suppressing the through current. The through current suppression function is implemented by optimizing the ratio (W/L) of the channel width W to the channel length L of the nMOS transistor DN1, thereby suppressing the through current Ia flowing from the pMOS transistor P1. For example, by setting the ratio (W/L) of the channel width W to the channel length L of the nMOS transistor DN1 to be smaller than 1, the through current Ia can be suppressed.

The second advantage is that the consumption current (i.e., the power consumption) can be reduced. In the first embodiment, it is possible to prevent the through current from occurring in the inverter without providing a current mirror as shown in Comparative Example 2. Thereby, it is possible to cut down a current Ib flowing through the pMOS transistor P22 and the constant current source IS, thus reducing the power consumption.

Figure 6:
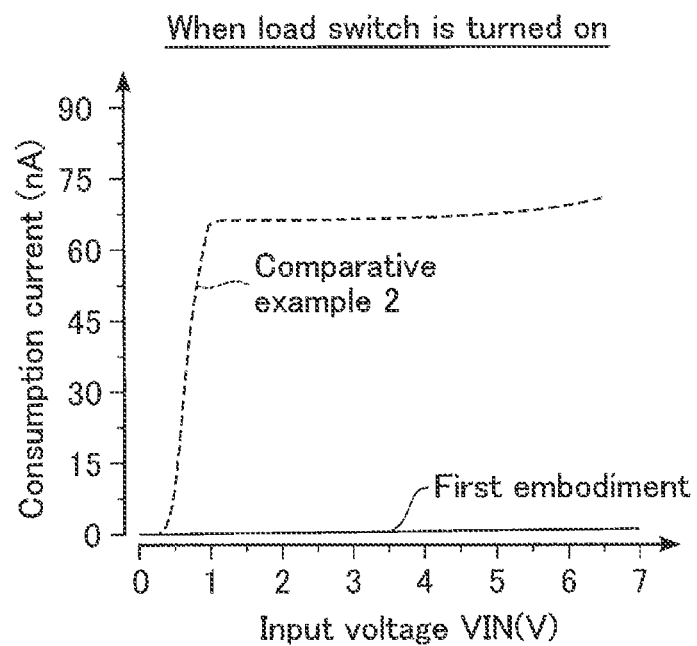
FIG. 6 is a diagram showing a consumption current when the semiconductor integrated circuit is in the on state according to the first embodiment.
Figure 7:
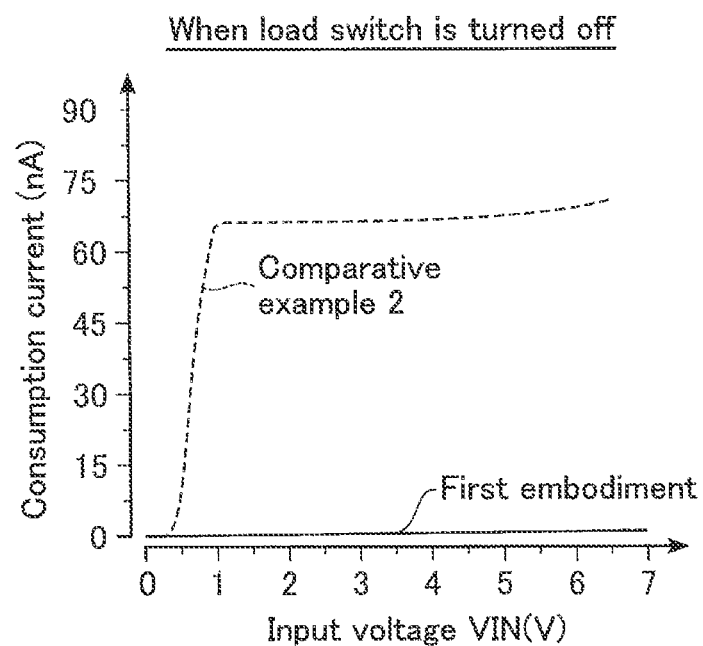
FIG. 7 is a diagram showing a consumption current when the semiconductor integrated circuit is in the off state according to the first embodiment.

FIG. 6 shows a consumption current when the load switch 30 is in the on state, namely, when the pMOS transistor P3 is in the on state. FIG. 7 shows a consumption current when the load switch 30 is in the off state, namely, when the pMOS transistor P3 is in the off state. As is clear from the above, the first embodiment is capable of greatly reducing the consumption current compared to Comparative Example 2.

The third advantage is that an output of an unstable voltage from the node NA can be prevented. In the first embodiment, even when a voltage that is one third of the input voltage VIN, for example, is input as the control voltage VCT, either the input voltage VIN or the reference voltage VSS is output from the node NA. Thereby, it is possible to prevent the unstable voltage that is neither the input voltage VIN nor the reference voltage VSS from being output from the node NA.

The output of the unstable voltage from the node NA can be prevented for the following reason.

In the case of, for example, an inverter configured only of a pMOS transistor P1 and an nMOS transistor N2, the drain current Id of each transistor can be expressed as follows:

$$Id = K'(W/L)(Vgs - Vth)^2(1 + \lambda Vds) \quad (1)$$

Here, K' is a constant determined by a process such as mobility and gate oxide film capacitance, Vgs is a gate-to-source voltage, Vth is a threshold voltage, λ is a channel length modulation effect, and Vds is a drain-to-source voltage.

Assuming that the control voltage VCT gradually increases from the reference voltage VSS, the gate-to-source voltage Vgs of the nMOS transistor N2 increases, resulting in an increase in the drain current Id. On the other hand, the gate-to-source voltage Vgs of the pMOS transistor P1 decreases, resulting in a decrease in the drain current Id. Ideally the output voltage of the inverter would change from the input voltage VIN to the reference voltage VSS at the moment when the drain current Id of the nMOS transistor N2 has exceeded the drain current Id of the pMOS transistor P1; however, such a change does not occur. This is because of the term (1+λVds) in Formula (1).

The drain-to-source voltage Vds of the nMOS transistor N2 is an output voltage of the inverter. The drain-to-source voltage Vds of the pMOS transistor P1 is (VIN–output voltage of inverter).

When the gate-to-source voltage Vgs of the nMOS transistor N2 increases and its drain current Id almost exceeds the drain current Id of the pMOS transistor P1, the output voltage of the inverter decreases, causing opposite phenomena in which the drain-to-source voltage Vds of the nMOS transistor N2 decreases (a decrease in drain current Id) and the drain-to-source voltage Vds of the pMOS transistor P1 increases (an increase in drain current Id).

Thus, the drain current Id of the nMOS transistor N2 does not increase as expected, and the drain current Id of the pMOS transistor P1 does not increase as expected. This causes an unfavorable situation in which two drain currents Id match and are well balanced. This balance causes a situation in which the output voltage of the inverter is stabilized at an intermediate voltage, causing an unfavorable output from the inverter of the unstable voltage (intermediate voltage) that is neither the reference voltage VSS nor the input voltage VIN and should be avoided.

On the other hand, in the first embodiment, the depletion-type nMOS transistor DN1 is coupled between the pMOS transistor P1 and the nMOS transistor N2. The nMOS transistor DN1 functions as a constant current source. The nMOS transistor DN1 as the constant current source produces an effect of constantly letting the same current flow, without depending on the drain-to-source voltage Vds. At this time, the (1+λVds) term in Formula (1) constantly becomes approximately 1. Since (1+λVds) is approximately 1, a current allowed to flow by the pMOS transistor P1 and the nMOS transistor DN1 is not affected by the output voltage of the inverter. Accordingly, an unfavorable situation in which the drain currents Id of the nMOS transistor N2 and the pMOS transistor P1 are well balanced is unlikely to occur.

It is thereby possible to prevent the output voltage of the inverter (i.e., the node NB voltage) from becoming the unstable voltage. Moreover, the output of the unstable voltage from the node NA can be prevented. The fourth advantage is that it is possible to prevent chattering from occurring in the output voltage VOUT, thus stabilizing the output voltage VOUT. In the first embodiment, the hysteresis circuit 13 is coupled between the input circuit 11 and the inverter 12. The hysteresis circuit 13 prevents chattering from occurring in the output voltage of the input circuit 11, namely, in the voltage of the node NB. Thereby, the output from the inverter 12 and the inversion logic circuit 20 that are coupled at the output stage of the node NB can be stabilized. As a result, it is possible to prevent chattering from occurring in the output voltage VOUT of the load switch 30, thus stabilizing the output voltage VOUT.

1.4 Modification of First Embodiment

Next, a semiconductor integrated circuit according to a modification of the first embodiment will be described. FIG. 8 is a circuit diagram showing a configuration of the semiconductor integrated circuit 1A according to the modification of the first embodiment.

The semiconductor integrated circuit 1A according to the modification includes a non-inversion logic circuit 21, in place of the inversion logic circuit 20 in the semiconductor integrated circuit 1 shown in FIG. 1. The input terminal of the non-inversion logic circuit 21 is coupled to the node NA, namely, the drain of the pMOS transistor P2 and the drain of the nMOS transistor N3. The output terminal of the non-inversion logic circuit 21 is coupled to the gate of the pMOS transistor P3. The non-inversion logic circuit 21 may have the function of reducing or preventing a sudden change of the pMOS transistor P3 to the on or off state by restricting the speed of change of the output voltage, in addition to the function of inverting the logic.

In the semiconductor integrated circuit 1A of the modification, when "L" is input as the control voltage VCT, the output of the non-inversion logic circuit 21 is brought to "L". Thereby, the load switch 30 supplies the input voltage VIN to the load 100 as the output voltage VOUT. On the other hand, when "H" is input as the control voltage VCT, the output of the non-inversion logic circuit 21 is brought to "H". Thereby, the load switch 30 interrupts supplying the input voltage VIN to the load 100.

The other configurations and advantageous effects of the semiconductor integrated circuit 1A according to the modification are similar to those of the semiconductor integrated circuit 1 of the first embodiment.

2. Second Embodiment

A semiconductor integrated circuit according to a second embodiment will be described below. The semiconductor integrated circuit according to the second embodiment includes the load switch, similarly to the first embodiment. The second embodiment is an example in which the hysteresis circuit 13 is changed to another hysteresis circuit in the semiconductor integrated circuit 1 of the first embodiment shown in FIG. 1. The other configurations are similar to that of the first embodiment described above. In the second embodiment, mainly differences from the first embodiment will be described.

2.1 Configuration of Second Embodiment

FIG. 9 is a circuit diagram showing a configuration of a semiconductor integrated circuit 2 according to the second embodiment. The semiconductor integrated circuit 2 includes a control circuit 10_2, the inversion logic circuit 20, and the load switch 30. The control circuit 10_2 controls the operation of the load switch 30 according to the control voltage VCT. The inversion logic circuit 20 and the load switch 30 are similar to those of the first embodiment.

The control circuit 10_2 will be described below.

The control circuit 10_2 includes the input circuit 11, the inverter 12, and a hysteresis circuit (or a chattering prevention circuit) 14.

The hysteresis circuit 14 prevents chattering from occurring in the voltage output from the input circuit 11. That is, the hysteresis circuit 14 stabilizes the output voltage of the input circuit 11. The hysteresis circuit 14 includes a pMOS transistor P4 and a depletion-type nMOS transistor DN6.

The circuit coupling of the hysteresis circuit 14 is as follows. The source of the pMOS transistor P4 is coupled to a node to which the input voltage VIN is supplied. That is, the input voltage VIN is supplied to the source of the pMOS transistor P4. The gate of the pMOS transistor P4 is coupled to the node NA, namely, the drain of the pMOS transistor P2 and the drain of an nMOS transistor N3. The drain of the pMOS transistor P4 is coupled to the drain of the nMOS transistor DN6.

The gate of the nMOS transistor DN6 is coupled to the source of the nMOS transistor DN6. The source of the nMOS transistor DN6 is coupled to the node NB, namely, the source of the nMOS transistor DN1, the drain of an nMOS transistor N2, the gate of the pMOS transistor P2, and the gate of the nMOS transistor N3.

2.2 Operation of Second Embodiment

Next, an operation of the semiconductor integrated circuit 2 according to the second embodiment will be described. The operation of the semiconductor integrated circuit 2 is similar to that of the first embodiment in either of the cases where the control voltage VCT is "L" and where the control voltage VCT is "H".

An operation when the control voltage VCT transitions from "L" to "H", or from "H" to "L" will be described.

The semiconductor integrated circuit 2 of the second embodiment includes the hysteresis circuit 14 to prevent chattering from occurring in the output voltage VOUT. In the second embodiment, by including the hysteresis circuit 14, the control voltage VCT when the output voltage VOUT transitions from the reference voltage VSS to the input voltage VIN and the control voltage VCT when the output voltage VOUT transitions from the input voltage VIN to the reference voltage VSS can be set to different voltage values.

Thereby, the pMOS transistor P3 has operation characteristics of not easily transitioning to the on state from the off state, and not easily transitioning to the off state from the on state, in accordance with an increase or decrease of the control voltage VCT. As a result, even when a control voltage VCT in the vicinity of a threshold voltage of the nMOS transistor N2 is input, it is possible to prevent chattering from occurring in the output voltage VOUT, thus stabilizing the voltage value of the output voltage VOUT.

An operation of the hysteresis circuit 14 provided at the output terminal (node NB) of the input circuit 11 will be described with reference to FIG. 3. For ease of explanation, the resistances of the pMOS transistor P1 and the nMOS transistors DN1 and N2 are respectively referred to as "RP1", "RDN1", and "RN2". Similarly, the resistances of the pMOS transistor P4 and the nMOS transistor DN6 are respectively referred to as "RP4" and "RDN6". The notation "((RP1+RDN1)//(RP4+RDN6))" indicates a combined resistance of RP1, RDN1, RP4, and RDN6 when the pMOS transistor P1 and the nMOS transistor DN1 are coupled in parallel to the pMOS transistor P4 and the nMOS transistor DN6.

When the control voltage VCT gradually increases from "L" and reaches a voltage VTH1 at which RN2 is lower than ((RP1+RDN1)//(RP4+RDN6)), the output voltage (node NB voltage) of the input circuit 11 is brought to "L", and the node NA voltage is brought to "H". At this time, since the pMOS transistor P4 is brought to the off state, and a current does not flow through the pMOS transistor P4 and the nMOS transistor DN6. In this case, ((RP1+RDN1)//(RP4+RDN6)) increases compared to when the pMOS transistor P4 is in the on state.

On the other hand, when the control voltage VCT gradually decreases from "H" and reaches a voltage VTH2 at which RN2 is higher than ((RP1+RDN1)//(RP4+RDN6)), the output voltage (node NB voltage) of the input circuit 11 is brought to "H", and the node NA voltage is brought to "L". At this time, since the pMOS transistor P4 is brought to the on state, a current flows through the pMOS transistor P4 and the nMOS transistor DN6. In this case, ((RP1+RDN1)//(RP4+RDN6)) decreases compared to when the pMOS transistor P4 is in the off state.

By thus causing the hysteresis circuit 14 including the pMOS transistor P4 and the nMOS transistor DN6 to transition to the on state or the off state, the control voltage VCT when the node NB voltage falls from "H" to "L" and the control voltage VCT when the node NB voltage rises from "L" to "H" are set to different voltage values. The node NA voltage is an inverted voltage of the node NB voltage. Thus, as shown in FIG. 3, the control voltage VCT when the node NA voltage rises from "L" to "H" and the control voltage VCT when the node NA voltage falls from "H" to "L" are set to different voltage values. Specifically, the control voltage VCT when the node NA voltage transitions from "L" to "H" is shifted toward the "H" side.

Accordingly, according to the second embodiment, by providing the hysteresis circuit 14, even when the control voltage VCT in the vicinity of a threshold voltage of the nMOS transistor N2 is input, it is possible to prevent chattering from occurring in the node NA voltage. It is thereby possible to prevent chattering from occurring in the output of the inversion logic circuit 20, thus stabilizing the voltage value of the output voltage VOUT.

2.3 Advantageous Effects of Second Embodiment

According to the second embodiment, it is possible to provide the semiconductor integrated circuit including the load switch equipped with the through current prevention function and capable of reducing power consumption.

The semiconductor integrated circuit 2 of the second embodiment produces mainly the four advantageous effects to be described below, similarly to the first embodiment.

The first advantage is that the through current can be prevented. The second advantage is that the consumption current (i.e., the power consumption) can be reduced. The third advantage is that an output of the unstable voltage from the node NA can be prevented.

The fourth advantage is that it is possible to prevent chattering from occurring in the output voltage VOUT, thus stabilizing the output voltage VOUT. In the second embodiment, the hysteresis circuit 14 is coupled between the input circuit 11 and the inverter 12. The hysteresis circuit 14 prevents chattering from occurring in the output voltage of the input circuit 11, namely, in the node NB voltage. Thereby, the output from the inverter 12 and the inversion logic circuit 20 that are coupled at the output stage of the node NB can be stabilized. As a result, it is possible to prevent chattering from occurring in the output voltage VOUT of the load switch 30, thus stabilizing the voltage value of the output voltage VOUT.

3. Third Embodiment

A semiconductor integrated circuit according to a third embodiment will be described below. The semiconductor integrated circuit according to the third embodiment includes the load switch, similarly to the first and second embodiments. The third embodiment is an example in which the hysteresis circuit 13 is changed to another hysteresis circuit in the semiconductor integrated circuit 1 of the first embodiment shown in FIG. 1. The other configurations are similar to that of the first embodiment described above. In the third embodiment, mainly differences from the first embodiment will be described.

3.1 Configuration of Third Embodiment

Figure 10:
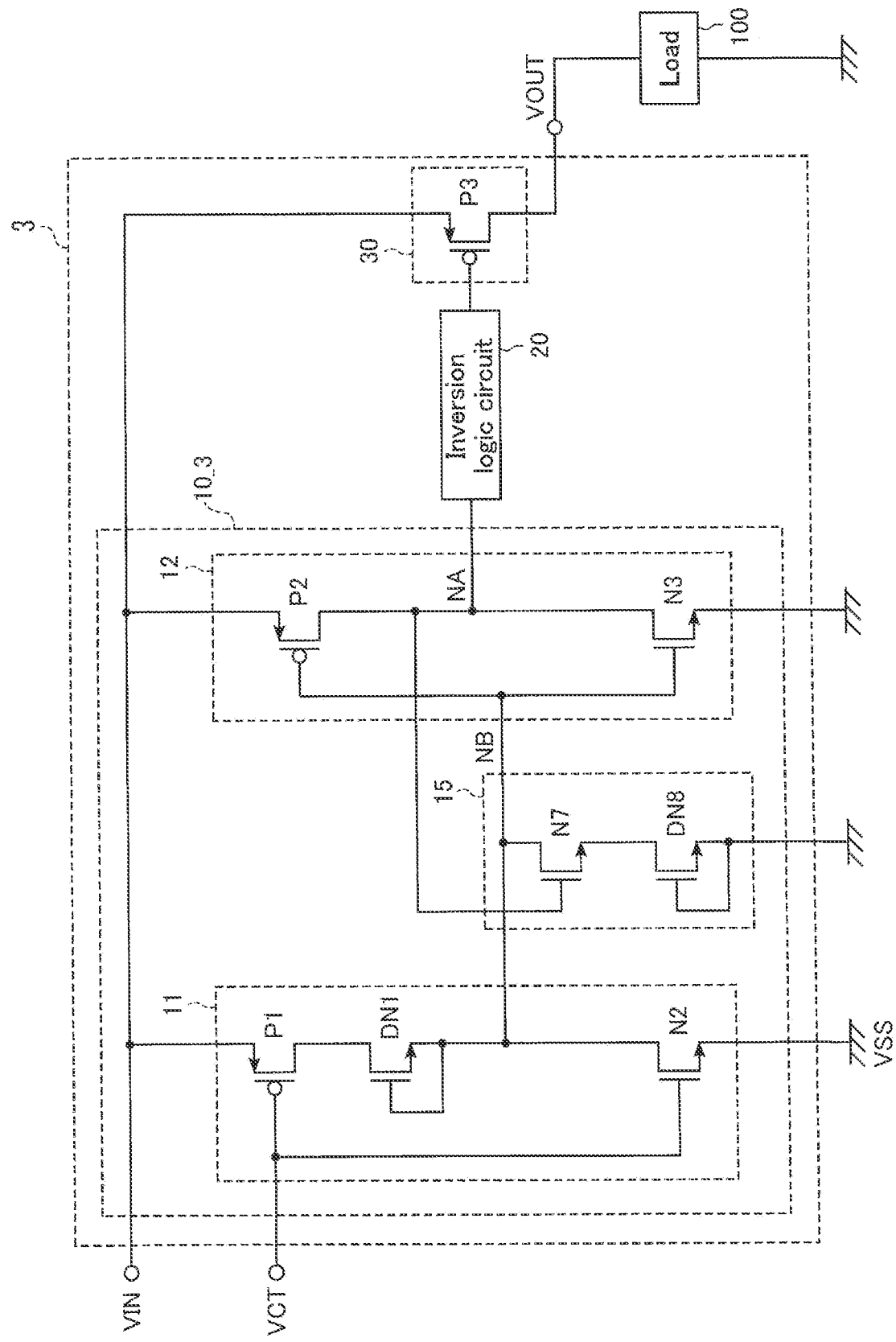
FIG. 10 is a circuit diagram showing a configuration of a semiconductor integrated circuit according to a third embodiment.

FIG. 10 is a circuit diagram showing a configuration of a semiconductor integrated circuit 3 according to the third embodiment. The semiconductor integrated circuit 3 includes a control circuit 10_3, the inversion logic circuit 20, and the load switch 30. The control circuit 10_3 controls the operation of the load switch 30 according to the control voltage VCT. The inversion logic circuit 20 and the load switch 30 are similar to those of the first embodiment.

The control circuit 10_3 will be described below.

The control circuit 10_3 includes the input circuit 11, the inverter 12, and a hysteresis circuit (or a chattering prevention circuit) 15.

The hysteresis circuit 15 prevents chattering from occurring in the voltage output from the input circuit 11. That is, the hysteresis circuit 15 stabilizes the output voltage of the input circuit 11. The hysteresis circuit 15 includes an nMOS transistor N7 and a depletion-type nMOS transistor DN8.

The circuit coupling of the hysteresis circuit 15 is as follows. The drain of the nMOS transistor N7 is coupled to the node NB, namely, the source of the nMOS transistor DN1, the drain of the nMOS transistor N2, the gate of the pMOS transistor P2, and the gate of the nMOS transistor N3. The gate of the nMOS transistor N7 is coupled to the node NA, namely, the drain of the pMOS transistor P2 and the drain of the nMOS transistor N3. The source of the nMOS transistor N7 is coupled to the drain of the nMOS transistor DN8.

The gate of the nMOS transistor DN8 is coupled to the source of the nMOS transistor DN8. The source of the nMOS transistor DN8 is coupled to a node to which the reference voltage VSS is supplied. That is, the reference voltage VSS is supplied to the source of the nMOS transistor DN8.

3.2 Operation of Third Embodiment

Next, an operation of the semiconductor integrated circuit 3 according to the third embodiment will be described. The operation of the semiconductor integrated circuit 3 is similar to that of the first embodiment in either of the cases where the control voltage VCT is "L" and where the control voltage VCT is "H".

An operation when the control voltage VCT transitions from "L" to "H", or from "H" to "L" will be described.

The semiconductor integrated circuit 3 of the third embodiment includes the hysteresis circuit 15 to prevent chattering from occurring in the output voltage VOUT. In the third embodiment, by including the hysteresis circuit 15, the control voltage VCT when the output voltage VOUT transitions from the reference voltage VSS to the input voltage VIN and the control voltage VCT when the output voltage VOUT transitions from the input voltage VIN to the reference voltage VSS can be set to different voltage values.

Thereby, the pMOS transistor P3 has operation characteristics of not easily transitioning to the on state from the off state, and not easily transitioning to the off state from the on state, in accordance with an increase or decrease of the control voltage VCT. As a result, even when the control voltage VCT in the vicinity of a threshold voltage of the nMOS transistor N2 is input, it is possible to prevent chattering from occurring in the output voltage VOUT, thus stabilizing the voltage value of the output voltage VOUT.

An operation of the hysteresis circuit 15 provided at the output terminal (node NB) of the input circuit 11 will be described with reference to FIG. 3. For ease of explanation, the resistances of the pMOS transistor P1 and the nMOS transistors DN1 and N2 are respectively referred to as "RP1", "RDN1", and "RN2". Similarly, the resistances of the nMOS transistor N7 and the nMOS transistor DN8 are respectively referred to as "RN7" and "RDN8". The notation "(RN2//(RN7+RDN8))" indicates a combined resistance of RN2, RN7, and RDN8 when the nMOS transistor N2 is coupled in parallel to the nMOS transistor N7 and the nMOS transistor DN8.

When the control voltage VCT gradually increases from "L" and reaches a voltage VTH1 at which RN2 is lower than (RP1+RDN1), the output voltage (node NB voltage) of the input circuit 11 is brought to "L", and the node NA voltage is brought to "H". When the node NB voltage is brought to "L" and the node NA voltage is brought to "H", the nMOS transistor N7 is brought to the on state, resulting in a decrease in (RN2//(RN7+RDN8)).

On the other hand, when the control voltage VCT gradually decreases from "H" and reaches a voltage VTH2 at which (RN2//(RN7+RDN8)) is higher than (RP1+RDN1), the output voltage of the input circuit 11, namely, the node NB voltage is brought to "H", and the node NA voltage is brought to "L". When the node NA voltage is brought to "L", the nMOS transistor N7 is brought to the off state, resulting in an increase in (RN2//(RN7+RDN8)).

By thus causing the hysteresis circuit 15 including the nMOS transistors N7 and DN8 to transition to the on state or the off state, the control voltage VCT when the node NB voltage falls from "H" to "L" and the control voltage VCT when the node NB voltage rises from "L" to "H" are set to different voltage values. The node NA voltage is an inverted voltage of the node NB voltage. Thus, as shown in FIG. 3, the control voltage VCT when the node NA voltage rises from "L" to "H" and the control voltage VCT when the node NA voltage falls from "H" to "L" are set to different voltage values. Specifically, the control voltage VCT when the node NA voltage transitions from "H" to "L" is shifted toward the "L" side.

Accordingly, according to the third embodiment, by providing the hysteresis circuit 15, even when the control voltage VCT in the vicinity of a threshold voltage of the nMOS transistor N2 is input, it is possible to prevent chattering from occurring in the node NA voltage. It is thereby possible to prevent chattering from occurring in the output of the inversion logic circuit 20, thus stabilizing the voltage value of the output voltage VOUT.

RDN1 is set to be smaller than RDN8. This is because when the control voltage transitions from "H" to "L", if (RP1+RDN1) is not smaller than (RN2//(RN7+RDN8)), the node NB voltage is not brought to "H", and remains "L" or becomes unstable.

3.3 Advantageous Effects of Third Embodiment

According to the third embodiment, it is possible to provide the semiconductor integrated circuit including the load switch equipped with the through current prevention function and capable of reducing power consumption.

The semiconductor integrated circuit 3 of the third embodiment produces mainly four advantageous effects to be described below, similarly to the first embodiment.

The first advantage is that the through current can be prevented. The second advantage is that the consumption current (i.e., the power consumption) can be reduced. The third advantage is that an output of the unstable voltage from the node NA can be prevented.

The fourth advantage is that it is possible to prevent chattering from occurring in the output voltage VOUT, thus stabilizing the output voltage VOUT. In the third embodiment, the hysteresis circuit 15 is coupled between the input circuit 11 and the inverter 12. The hysteresis circuit 15 prevents chattering from occurring in the output voltage of the input circuit 11, namely, in the voltage of the node NB. Thereby, the output from the inverter 12 and the inversion logic circuit 20 that are coupled at the output stage of the node NB can be stabilized. As a result, it is possible to prevent chattering from occurring in the output voltage VOUT of the load switch 30, thus stabilizing the voltage value of the output voltage VOUT.

4. Fourth Embodiment

A semiconductor integrated circuit according to a fourth embodiment will be described below. The semiconductor integrated circuit according to the fourth embodiment includes a regulator. The regulator is a circuit that outputs a stable constant voltage to a load such as an electronic circuit.

The fourth embodiment is an example in which a configuration of a regulator is comprised, in place of the inversion logic circuit 20 and the load switch 30 in the semiconductor integrated circuit 1 of the first embodiment. In other words, in this example, a configuration of a regulator is added to the control circuit 10_1 of the semiconductor integrated circuit 1. The other configurations are similar to that of the first embodiment described above. In the fourth embodiment, mainly differences from the first embodiment will be described.

4.1 Configuration of Fourth Embodiment

Figure 11:
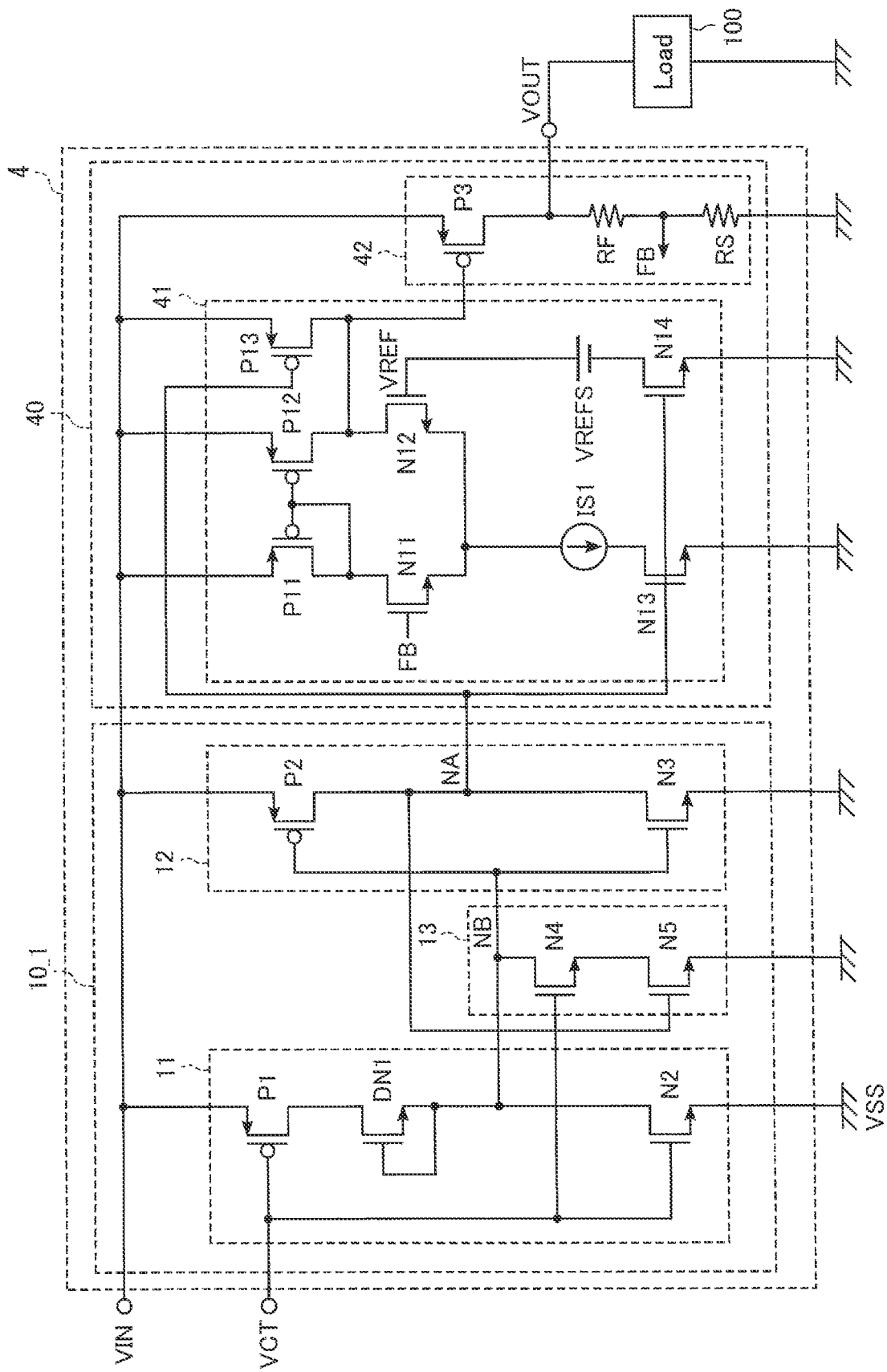
FIG. 11 is a circuit diagram showing a configuration of a semiconductor integrated circuit according to a fourth embodiment.

FIG. 11 is a circuit diagram showing a configuration of a semiconductor integrated circuit 4 according to the fourth embodiment. The semiconductor integrated circuit 4 includes a regulator 40 which supplies a certain voltage as the output voltage VOUT to the load 100 arranged at the output stage of the semiconductor integrated circuit 4, without depending on the input voltage VIN.

The semiconductor integrated circuit 4 includes the control circuit 10_1 and the regulator 40. The control circuit 10_1 controls the regulator 40 to be switched between an operating state and a non-operating state, according to the control voltage VCT. The circuit configuration of the control circuit 10_1 is similar to that of the first embodiment.

Next, the regulator 40 will be described below. The regulator 40 includes a first gain circuit 41 and an output circuit 42. The first gain circuit 41 outputs a voltage that is determined according to the magnitudes of the feedback voltage FB and the reference voltage VREF to the gate of the nMOS transistor P3. The first gain circuit 41 includes nMOS transistors N11, N12, N13, and N14, and pMOS transistors P11, P12, and P13, a constant current source IS1, and a reference voltage source VREFS. The constant current source IS1 is a power supply capable of providing a certain amount of current. The reference voltage source VREFS is a power supply capable of generating a reference voltage VREF without depending on the temperature.

The output circuit 42 increases or decreases the voltage value of the output voltage VOUT according to the voltage output from the first gain circuit 41. The output circuit 42 includes a pMOS transistor P3, a resistance RF, and a resistance RS. The resistance RF and the resistance RS configure a feedback circuit. The feedback circuit outputs the feedback voltage FB obtained by dividing the output voltage VOUT using the resistance RF and the resistance RS.

Circuit coupling of the first gain circuit 41 and the output circuit 42 in the regulator 40 will be described.

The source of the pMOS transistor P11 is coupled to a node to which the input voltage VIN is supplied. That is, the input voltage VIN is supplied to the source of the pMOS transistor P11. The gate of the pMOS transistor P11 is coupled to the drain of the pMOS transistor P11. The drain of the pMOS transistor P11 is coupled to the drain of the nMOS transistor N11.

The source of the nMOS transistor N11 is coupled to the drain of the nMOS transistor N13 via the constant current source IS1. The source of the nMOS transistor N13 is coupled to a node to which the reference voltage VSS is supplied. That is, the reference voltage VSS is supplied to the source of the nMOS transistor N13.

The source of the pMOS transistor P12 is coupled to the node to which the input voltage VIN is supplied. That is, the input voltage VIN is supplied to the source of the pMOS transistor P12. The gate of the pMOS transistor P12 is coupled to the gate of the pMOS transistor P11. The drain of the pMOS transistor P12 is coupled to the drain of the nMOS transistor N12. The source of the nMOS transistor N12 is coupled to the source of the nMOS transistor N11 and the constant current source IS1.

The gate of the nMOS transistor N12 is coupled to the reference voltage source VREFS. That is, the reference voltage VREF supplied from the reference voltage source VREFS is supplied to the gate of the nMOS transistor N12. Furthermore, the reference voltage source VREFS is coupled to the drain of the nMOS transistor N14. The source of the nMOS transistor N14 is coupled to the node to which the reference voltage VSS is supplied. That is, the reference voltage VSS is supplied to the source of the nMOS transistor N14.

The source of the pMOS transistor P13 is coupled to the node to which the input voltage VIN is supplied. That is, the input voltage VIN is supplied to the source of the pMOS transistor P13. The gate of the pMOS transistor P13 is coupled to the node NA, namely, the drain of the pMOS transistor P2 and the drain of the nMOS transistor N3. The drain of the pMOS transistor P13 is coupled to the drain of the pMOS transistor P12, the drain of the nMOS transistor N12, and the gate of the pMOS transistor P3.

The gate of the nMOS transistor N13 and the gate of the nMOS transistor N14 are coupled to the node NA, namely, the drain of the pMOS transistor P2 and the drain of the nMOS transistor N3.

The source of the pMOS transistor P3 is coupled to the node to which the input voltage VIN is supplied. That is, the input voltage VIN is supplied to the source of the pMOS transistor P3. The gate of the pMOS transistor P3 is coupled to the drain of the pMOS transistor P12 and the drain of the nMOS transistor N12.

The drain of the pMOS transistor P3 is coupled to the node to which the reference voltage VSS is supplied via resistances RF and RS. That is, the reference voltage VSS is supplied to the drain of the pMOS transistor P3 via the resistances RS and RF. A node between the resistances RF and RS is coupled to the gate of the nMOS transistor N11. A feedback voltage FB is supplied to the gate of the nMOS transistor N11 from the node between the resistances RF and RS.

Furthermore, the drain of the pMOS transistor P3 is coupled to a load 100 arranged at the output stage of the pMOS transistor P3. The load 100 is provided outside the semiconductor integrated circuit 4. The pMOS transistor P3 supplies a certain voltage to the load 100 as the output voltage VOUT or stops supplying the output voltage VOUT.

4.2 Operation of Fourth Embodiment

An operation of the semiconductor integrated circuit 4 according to the fourth embodiment will be described below. It is assumed that the input voltage VIN that allows all the MOS transistors to stably operate is supplied to the semiconductor integrated circuit 4.

(1) When Control Voltage VCT is "L"

Assuming, for example, that the input voltage VIN is 3.6 V (hereinafter referred to as "H") and the control voltage VCT is the reference voltage VSS (hereinafter referred to as "L"), the operation is as follows.

When the control voltage VCT is "L", the pMOS transistor P1 is brought to the on state, and the nMOS transistors N2 and N4 are brought to the off state. Thereby, the node NB is brought to "H" (e.g., 3.6 V). Since the nMOS transistor N2 is in the off state, a current does not flow through a line in which the pMOS transistor P1, the nMOS transistor DN1, and the nMOS transistor N2 are coupled in series. That is, a through current that flows from the node of the input voltage VIN to the node of the reference voltage VSS via the input circuit 11 is not generated.

When the node NB is brought to "H", the pMOS transistor P2 is brought to the off state, and the nMOS transistor N3 is brought to the on state. Thereby, the node NA is brought to "L". At this time, since the pMOS transistor P2 is in the off state, a current does not flow through a line in which the pMOS transistor P2 and the nMOS transistor N3 are coupled in series. That is, a through current that flows from the node of the input voltage VIN to the node of the reference voltage VSS via the inverter 12 is not generated.

When the node NA is brought to "L", "L" is supplied to the gate of the pMOS transistor P13 and the gates of the nMOS transistors N13 and N14. Thus, the pMOS transistor P13 is brought to the on state, and the nMOS transistors N13 and N14 are brought to the off state.

The feedback voltage FB is supplied to the gate of the nMOS transistor N11. The feedback voltage FB is a voltage obtained by dividing the output voltage VOUT using the resistances RF and RS. The reference voltage VREF is supplied to the gate of the nMOS transistor N12. Since the pMOS transistor P13 is in the on state, the input voltage VIN is supplied to the gate of the pMOS transistor P3 via the pMOS transistor P13.

Thereby, the input voltage VIN is supplied to the gate of the pMOS transistor P3, and the pMOS transistor P3 is brought to the off state and stops outputting the output voltage VOUT. As a result, the regulator 40 stops operating, namely, is brought to the non-operating state.

(2) When Control Voltage VCT is "H"

When, for example, the input voltage VIN is 3.6 V and the control voltage VCT is 3.6 V or 1.8 V (hereinafter referred to as "H"), which is half the voltage of the input voltage VIN, the operation is as follows.

When the control voltage VCT is "H" (e.g., 3.6 V or 1.8 V), the pMOS transistor P1 is brought to the off state, and the nMOS transistors N2 and N4 are brought to the on state. Thereby, the node NB is brought to "L". Since the pMOS transistor P1 is in the off state, a current does not flow through a line in which the pMOS transistor P1, the nMOS transistor DN1, and the nMOS transistor N2 are coupled in series. That is, a through current that flows from the node of the input voltage VIN to the node of the reference voltage VSS via the input circuit 11 is not generated.

When the node NB is brought to "L", the pMOS transistor P2 is brought to the on state, and the nMOS transistor N3 is brought to the off state. Thereby, the node NA is brought to "H". At this time, since the nMOS transistor N3 is in the off state, a current does not flow through a line in which the pMOS transistor P2 and the nMOS transistor N3 are coupled in series. That is, a through current that flows from the node of the input voltage VIN to the node of the reference voltage VSS via the inverter 12 is not generated.

When the node NA is brought to "H", "H" is supplied to the gate of the pMOS transistor P13 and the gates of the nMOS transistors N13 and N14. Thus, the pMOS transistor P13 is brought to the off state, and the nMOS transistors N13 and N14 are brought to the on state. Thereby, the regulator 40 starts operation, namely, is brought to the operating state.

The feedback voltage FB is supplied to the gate of the nMOS transistor N11. The feedback voltage FB is a voltage obtained by dividing the output voltage VOUT using the resistances RF and RS. The reference voltage VREF is supplied to the gate of the nMOS transistor N12. Here, since the pMOS transistor P13 is in the off state, a voltage that is determined according to the voltage difference between the feedback voltage FB and the reference voltage VREF is supplied to the gate of the pMOS transistor P3.

When the reference voltage VREF is higher than the feedback voltage FB (VREF>FB), the pMOS transistor P3 increases the output voltage VOUT. On the other hand, when the reference voltage VREF is lower than the feedback voltage FB (VREF<FB), the pMOS transistor P3 decreases the output voltage VOUT. This ultimately makes the output voltage VOUT converge to a constant voltage in such a manner that the reference voltage VREF and the feedback voltage FB become equal. That is, the pMOS transistor P3 outputs the convergent constant voltage as the output voltage VOUT.

(3) When Control Voltage VCT Transitions from "L" to "H", or from "H" to "L"

The fourth embodiment includes the hysteresis circuit 13 to prevent chattering from occurring in the node NA voltage, similarly to the first embodiment. In the fourth embodiment, by including the hysteresis circuit 13, the control voltage VCT when the node NA voltage transitions from the reference voltage VSS to the input voltage VIN and the control voltage VCT when the node NA voltage transitions from the input voltage VIN to the reference voltage VSS can be set to different voltage values.

Thereby, the pMOS transistor P13 has operation characteristics of not easily transitioning to the on state from the off state, and not easily transitioning to the off state from the on state, in accordance with an increase or decrease of the control voltage VCT. As a result, even when a control voltage VCT in the vicinity of a threshold voltage of the nMOS transistor N2 is input, it is possible to prevent chattering from occurring in the node NA voltage, thus stabilizing the operation control of the regulator 40.

The operation of the hysteresis circuit 13 is similar to that of the hysteresis circuit 13 in the first embodiment.

In the above description about the operation, the node NA voltage is input to the gates of the pMOS transistor P13 and the nMOS transistors N13 and N14; however, a configuration may be adopted in which a node NB voltage, in place of the node NA voltage, is input to the gates of the pMOS transistor P13 and the nMOS transistors N13 and N14. In this case, when "H" is input as the control voltage VCT, the regulator 40 is brought to the non-operating state, and when "L" is input as the control voltage VCT, the regulator 40 is brought to the operating state.

In the fourth embodiment, the first gain circuit 41 is arranged between the inverter 12 and the output circuit 42; however, two gain circuits may be arranged. That is, a second gain circuit may be arranged between the first gain circuit 41 and the output circuit 42. By arranging the second gain circuit, a gain in the regulator increases, thus improving the constant voltage characteristics.

4.3 Advantageous Effects of Fourth Embodiment

According to the fourth embodiment, it is possible to provide the semiconductor integrated circuit including the regulator equipped with the through current prevention function and capable of reducing power consumption.

The semiconductor integrated circuit 4 of the fourth embodiment produces advantageous effects to be described below, similarly to the first embodiment.

The first advantage is that the through current can be prevented. The second advantage is that the consumption current (i.e., the power consumption) can be reduced. The third advantage is that an output of the unstable voltage from the node NA can be prevented.

Moreover, the semiconductor integrated circuit 4 is capable of preventing chattering from occurring in the node NA voltage, thus stabilizing the operation of the regulator 40.

5. Fifth Embodiment

A semiconductor integrated circuit according to a fifth embodiment will be described below. The semiconductor integrated circuit according to the fifth embodiment includes a regulator, similarly to the fourth embodiment. The fifth embodiment is an example in which the hysteresis circuit 13 is changed to the hysteresis circuit 14 in the semiconductor integrated circuit 4 of the fourth embodiment shown in FIG. 11. In other words, in this example, a configuration of a regulator is added to the control circuit 10_2 of the semiconductor integrated circuit 2 of the second embodiment. The other configurations are similar to that of the second or fourth embodiment described above. In the fifth embodiment, mainly differences from the second or fourth embodiment will be described.

5.1 Configuration of Fifth Embodiment

FIG. 12 is a circuit diagram showing a configuration of a semiconductor integrated circuit 5 according to the fifth embodiment. The semiconductor integrated circuit 5 includes the control circuit 10_2 and the regulator 40. The control circuit 10_2 controls the regulator 40 to be switched between the operating state and the non-operating state, according to the control voltage VCT. The circuit configuration of the control circuit 10_2 is similar to that of the second embodiment. The regulator 40 includes the first gain circuit 41 and the output circuit 42. The circuit configuration of the regulator 40 is similar to that of the fourth embodiment.

5.2 Operation of Fifth Embodiment

Hereinafter, an operation of the semiconductor integrated circuit 5 according to the fifth embodiment will be described below. The operation of the semiconductor integrated circuit 5 is similar to that of the fourth embodiment in any of the cases where the control voltage VCT is "L", where the control voltage VCT is "H", and where the control voltage VCT transitions from "L" to "H", or from "H" to "L".

The operation of the hysteresis circuit 14 in the semiconductor integrated circuit 5 is similar to that of the hysteresis circuit 14 in the second embodiment.

5.3 Advantageous Effects of Fifth Embodiment

According to the fifth embodiment, it is possible to provide the semiconductor integrated circuit including the regulator equipped with the through current prevention function and capable of reducing power consumption.

The semiconductor integrated circuit 5 of the fifth embodiment produces advantageous effects to be described below, similarly to the first embodiment.

The first advantage is that the through current can be prevented. The second advantage is that the consumption current (i.e., the power consumption) can be reduced. The third advantage is that an output of the unstable voltage from the node NA can be prevented.

Moreover, the semiconductor integrated circuit 5 is capable of preventing chattering from occurring in the node NA voltage, thus stabilizing the operation of the regulator 40.

6. Sixth Embodiment

A semiconductor integrated circuit according to a sixth embodiment will be described below. The semiconductor integrated circuit according to the sixth embodiment includes a regulator, similarly to the fourth and fifth embodiments. The sixth embodiment is an example in which the hysteresis circuit 13 is changed to the hysteresis circuit 15 in the semiconductor integrated circuit 4 of the fourth embodiment shown in FIG. 11. In other words, in this example, a configuration of the regulator is added to the control circuit 10_3 of the semiconductor integrated circuit 3 of the third embodiment. The other configurations are similar to that of the third or fourth embodiment described above. In the sixth embodiment, mainly differences from the third or fourth embodiment will be described.

6.1 Configuration of Sixth Embodiment

FIG. 13 is a circuit diagram showing a configuration of a semiconductor integrated circuit 6 according to the sixth embodiment. The semiconductor integrated circuit 6 includes the control circuit 10_3 and the regulator 40. The control circuit 10_3 controls the regulator 40 to be switched between the operating state and the non-operating state, according to the control voltage VCT. The circuit configuration of the control circuit 10_3 is similar to that of the third embodiment. The regulator 40 includes the first gain circuit 41 and the output circuit 42. The circuit configuration of the regulator 40 is similar to that of the fourth embodiment.

6.2 Operation of Sixth Embodiment

An operation of the semiconductor integrated circuit 6 according to the sixth embodiment will be described below. The operation of the semiconductor integrated circuit 6 is similar to that of the fourth embodiment in any of the cases where the control voltage VCT is "L", where the control voltage VCT is "H", and where the control voltage VCT transitions from "L" to "H" or from "H" to "L".

The operation of the hysteresis circuit 15 in the semiconductor integrated circuit 6 is similar to that of the hysteresis circuit 15 in the third embodiment.

6.3 Advantageous Effects of Sixth Embodiment

According to the sixth embodiment, it is possible to provide the semiconductor integrated circuit including the regulator equipped with the through current prevention function and capable of reducing power consumption.

The semiconductor integrated circuit 6 of the sixth embodiment produces advantageous effects to be described below, similarly to the first embodiment.

The first advantage is that the through current can be prevented. The second advantage is that the consumption current (i.e., the power consumption) can be reduced. The third advantage is that an output of the unstable voltage from the node NA can be prevented.

Moreover, the semiconductor integrated circuit 6 is capable of preventing chattering from occurring in the node NA voltage, thus stabilizing the operation of the regulator 40.

7. Seventh Embodiment

A semiconductor integrated circuit according to a seventh embodiment will be described below. The semiconductor integrated circuit according to the seventh embodiment includes an operation amplifier. The operation amplifier is a circuit that outputs a voltage that is determined according to a voltage difference between two input voltages to a load such as an electronic circuit.

The seventh embodiment is an example in which a configuration of the operation amplifier is comprised, in place of the inversion logic circuit 20 and the load switch 30 in the semiconductor integrated circuit 1 of the first embodiment. In other words, in this example, a configuration of the operation amplifier is added to the control circuit 10_1 of the semiconductor integrated circuit 1. The other configurations are similar to that of the first embodiment described above. In the seventh embodiment, mainly differences from the first embodiment will be described.

7.1 Configuration of Seventh Embodiment

Figure 14:
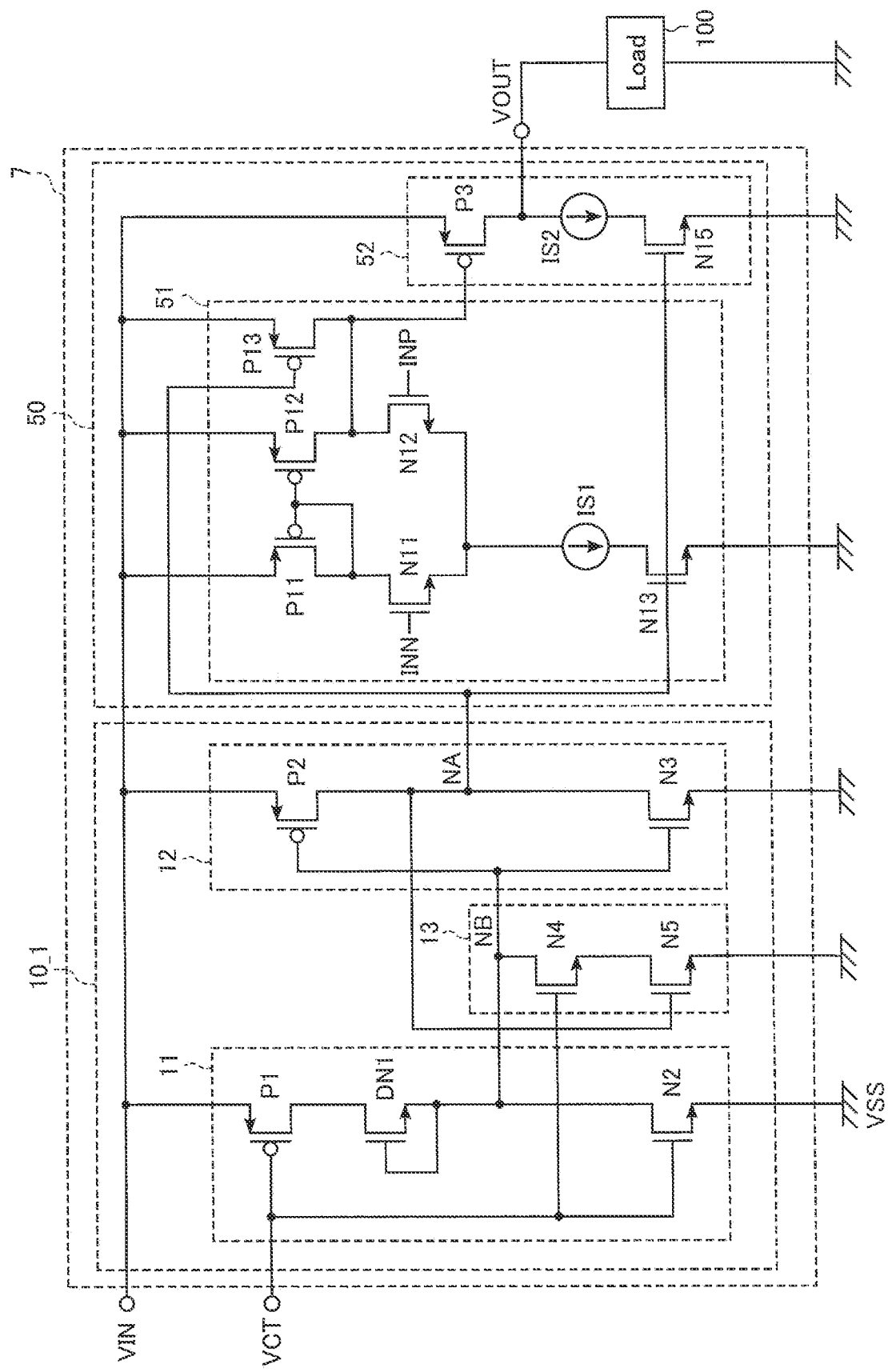
FIG. 14 is a circuit diagram showing a configuration of a semiconductor integrated circuit according to a seventh embodiment.

FIG. 14 is a circuit diagram showing a configuration of a semiconductor integrated circuit 7 according to the seventh embodiment. The semiconductor integrated circuit 7 includes an operation amplifier 50 that supplies a voltage that is determined according to a voltage difference between the voltage INP and the voltage INN as the output voltage VOUT to the load 100 arranged at the output stage of the semiconductor integrated circuit 7.

The semiconductor integrated circuit 7 includes the control circuit 10_1 and the operation amplifier 50. The control circuit 10_1 controls the operation amplifier 50 to be switched between the operating state and the non-operating state, according to the control voltage VCT. The circuit configuration of the control circuit 10_1 is similar to that of the first embodiment.

The operation amplifier 50 will be described below. The operation amplifier 50 includes a first gain circuit 51 and an output circuit 52. The first gain circuit 51 receives two voltages, a voltage INN and a voltage INP, and outputs a voltage that is amplified according to a voltage difference between the voltages INN and INP to the gate of the pMOS transistor P3. The first gain circuit 51 includes nMOS transistors N11, N12, and N13, and pMOS transistors P11, P12, and P13, and a constant current source IS1.

The output circuit 52 increases or decreases the voltage value of the output voltage VOUT according to the voltage output from the first gain circuit 51. The output circuit 52 includes the pMOS transistor P3, an nMOS transistor N15, and a constant current source IS2. The constant current source IS2 is a power supply capable of providing a certain amount of current.

Circuit coupling of the first gain circuit 51 and the output circuit 52 in the operation amplifier 50 will be described.

The source of the pMOS transistor P11 is coupled to a node to which the input voltage VIN is supplied. That is, the input voltage VIN is supplied to the source of the pMOS transistor P11. The gate of the pMOS transistor P11 is coupled to the drain of the pMOS transistor P11. The drain of the pMOS transistor P11 is coupled to the drain of the nMOS transistor N11.

The source of the nMOS transistor N11 is coupled to the drain of the nMOS transistor N13 via the constant current source IS1. The source of the nMOS transistor N13 is coupled to a node to which the reference voltage VSS is supplied. That is, the reference voltage VSS is supplied to the source of the nMOS transistor N13.

The source of the pMOS transistor P12 is coupled to the node to which the input voltage VIN is supplied. That is, the input voltage VIN is supplied to the source of the pMOS transistor P12. The gate of the pMOS transistor P12 is coupled to the gate of the pMOS transistor P11. The drain of the pMOS transistor P12 is coupled to the drain of the nMOS transistor N12. The source of the nMOS transistor N12 is coupled to the source of the nMOS transistor N11 and the constant current source IS1.

The source of the pMOS transistor P13 is coupled to the node to which the input voltage VIN is supplied. That is, the input voltage VIN is supplied to the source of the pMOS transistor P13. The gate of the pMOS transistor P13 is coupled to the node NA, namely, the drain of the pMOS transistor P2 and the drain of the nMOS transistor N3. The drain of the pMOS transistor P13 is coupled to the drain of the pMOS transistor P12, the drain of the nMOS transistor N12, and the gate of the pMOS transistor P3. The gate of the nMOS transistor N13 is coupled to the node NA, namely, the drain of the pMOS transistor P2 and the drain of the nMOS transistor N3.

The source of the pMOS transistor P3 is coupled to the node to which the input voltage VIN is supplied. That is, the input voltage VIN is supplied to the source of the pMOS transistor P3. The gate of the pMOS transistor P3 is coupled to the drain of the pMOS transistor P12 and the drain of the nMOS transistor N12.

The drain of the pMOS transistor P3 is coupled to the drain of the nMOS transistor N15 via the constant current source IS2. The source of the nMOS transistor N15 is coupled to the node to which the reference voltage VSS is supplied. That is, the reference voltage VSS is supplied to the source of the nMOS transistor N15. The gate of the nMOS transistor N15 is coupled to the node NA, namely, the drain of the pMOS transistor P2 and the drain of the nMOS transistor N3.

Furthermore, the drain of the pMOS transistor P3 is coupled to the load 100 arranged at the output stage of the pMOS transistor P3. The load 100 is provided outside the semiconductor integrated circuit 4. The pMOS transistor P3 supplies, as the output voltage VOUT to the load 100, a voltage that is determined according to a voltage difference between the voltages INP and INN, or stops supplying the output voltage VOUT.

The output voltage VOUT is supplied to the gate of the nMOS transistor N11 as the voltage INN directly or via a resistance, a capacitance, or a coil.

7.2 Operation of Seventh Embodiment

An operation of the semiconductor integrated circuit 7 according to the seventh embodiment will be described below. It is assumed that the input voltage VIN that allows all the MOS transistors to stably operate is supplied to the semiconductor integrated circuit 7.

(1) When Control Voltage VCT is "L"

Assuming, for example, that the input voltage VIN is 3.6 V (hereinafter referred to as "H") and the control voltage VCT is the reference voltage VSS (hereinafter referred to as "L"), the operation is as follows.

When the control voltage VCT is "L", the pMOS transistor P1 is brought to the on state, and the nMOS transistors N2 and N4 are brought to the off state. Thereby, the node NB is brought to "H" (e.g., 3.6 V). Since the nMOS transistor N2 is in the off state, a current does not flow through a line in which the pMOS transistor P1, the nMOS transistor DN1, and the nMOS transistor N2 are coupled in series. That is, a through current that flows from the node of the input voltage VIN to the node of the reference voltage VSS via the input circuit 11 is not generated.

When the node NB is brought to "H", the pMOS transistor P2 is brought to the off state, and the nMOS transistor N3 is brought to the on state. Thereby, the node NA is brought to "L". At this time, since the pMOS transistor P2 is in the off state, a current does not flow through a line in which the pMOS transistor P2 and the nMOS transistor N3 are coupled in series. That is, a through current that flows from the node of the input voltage VIN to the node of the reference voltage VSS via the inverter 12 is not generated.

When the node NA is brought to "L", "L" is supplied to the gate of the pMOS transistor P13 and the gates of the nMOS transistors N13 and N15. Thus, the pMOS transistor P13 is brought to the on state, and the nMOS transistors N13 and N15 are brought to the off state.

The voltage INN is supplied to the gate of the nMOS transistor N11. The voltage INN is a voltage obtained by supplying an output voltage VOUT directly or via a resistance, a capacitance, or a coil. The voltage INP is supplied to the gate of the nMOS transistor N12. Since the pMOS transistor P13 is in the on state, the input voltage VIN is supplied to the gate of the pMOS transistor P3 via the pMOS transistor P13.

Thereby, the input voltage VIN is supplied to the gate of the pMOS transistor P3, and the pMOS transistor P3 is brought to the off state and stops outputting the output voltage VOUT. As a result, the operation amplifier 50 stops operating, namely, is brought to the non-operating state.

(2) When Control Voltage VCT is "H"

When, for example, the input voltage VIN is 3.6 V and the control voltage VCT is 3.6 V or 1.8 V (hereinafter referred to as "H"), which is half the voltage of the input voltage VIN, the operation is as follows.

When the control voltage VCT is "H" (e.g., 3.6 V or 1.8 V), the pMOS transistor P1 is brought to the off state, and the nMOS transistors N2 and N4 are brought to the on state. Thereby, the node NB is brought to "L". Since the pMOS transistor P1 is in the off state, a current does not flow through a line in which the pMOS transistor P1, the nMOS transistor DN1, and the nMOS transistor N2 are coupled in series. That is, a through current that flows from the node of the input voltage VIN to the node of the reference voltage VSS via the input circuit 11 is not generated.

When the node NB is brought to "L", the pMOS transistor P2 is brought to the on state, and the nMOS transistor N3 is brought to the off state. Thereby, the node NA is brought to "H". At this time, since the nMOS transistor N3 is in the off state, a current does not flow through a line in which the pMOS transistor P2 and the nMOS transistor N3 are coupled in series. That is, a through current that flows from the node of the input voltage VIN to the node of the reference voltage VSS via the inverter 12 is not generated.

When the node NA is brought to "H", "H" is supplied to the gate of the pMOS transistor P13 and the gates of the nMOS transistors N13 and N15. Thus, the pMOS transistor P13 is brought to the off state, and the nMOS transistors N13 and N15 are brought to the on state. Thereby, the operation amplifier 50 starts operation, namely, is brought to the operating state.

The voltage INN is supplied to the gate of the nMOS transistor N11. The voltage INN is a voltage obtained by supplying the output voltage VOUT directly or via a resistance, a capacitance, or a coil. The voltage INP is supplied to the gate of the nMOS transistor N12. Here, since the pMOS transistor P13 is in the off state, a voltage that is amplified according to a voltage difference between the voltage INP and the voltage INN is supplied to the gate of the pMOS transistor P3.

When the voltage INP is higher than the voltage INN (INP>INN), the pMOS transistor P3 increases the output voltage VOUT. On the other hand, when the voltage INP is lower than the voltage INN (INP<INN), the pMOS transistor P3 decreases the output voltage VOUT. This ultimately makes the output voltage VOUT converge, in such a manner that the voltages INP and INN become equal. That is, the pMOS transistor P3 outputs a convergent voltage as the output voltage VOUT.

(3) When Control Voltage VCT Transitions from "L" to "H", or from "H" to "L"

In the seventh embodiment, the hysteresis circuit 13 is provided to prevent chattering from occurring in the node NA voltage, similarly to the first embodiment. In the seventh embodiment, by including the hysteresis circuit 13, the control voltage VCT when the node NA voltage transitions from the reference voltage VSS to the input voltage VIN and the control voltage VCT when the node NA voltage transitions from the input voltage VIN to the reference voltage VSS can be set to different voltage values.

Thereby, the pMOS transistor P13 has operation characteristics of not easily transitioning to the on state from the off state, and not easily transitioning to the off state from the on state, in accordance with an increase or decrease of the control voltage VCT. As a result, even when a control voltage VCT in the vicinity of a threshold voltage of the nMOS transistor N2 is input, it is possible to prevent chattering from occurring in the node NA voltage, thus stabilizing the operation control of the operation amplifier 50.

The operation of the hysteresis circuit 13 is similar to that of the hysteresis circuit 13 in the first embodiment.

In the above description about the operation, the node NA voltage is input to the gates of the pMOS transistor P13 and the nMOS transistors N13 and N15; however, a configuration may be adopted in which the node NB voltage, in place of the node NA voltage, is input to the gates of the pMOS transistor P13 and the nMOS transistors N13 and N15. In this case, when "H" is input as the control voltage VCT, the operation amplifier 50 is brought to the non-operating state, and when "L" is input as the control voltage VCT, the operation amplifier 50 is brought to the operating state.

In the seventh embodiment, the first gain circuit 51 is arranged between the inverter 12 and the output circuit 52; however, two gain circuits may be arranged. That is, a second gain circuit may be arranged between the first gain circuit 51 and the output circuit 52. By arranging the second gain circuit, a gain in the operation amplifier 50 increases, thus improving the amplification characteristics.

7.3 Advantageous Effects of Seventh Embodiment

According to the seventh embodiment, it is possible to provide the semiconductor integrated circuit including the operation amplifier equipped with the through current prevention function and capable of reducing power consumption.

The semiconductor integrated circuit 7 of the seventh embodiment produces advantageous effects to be described below, similarly to the first embodiment.

The first advantage is that the through current can be prevented. The second advantage is that the consumption current (i.e., the power consumption) can be reduced. The third advantage is that an output of the unstable voltage from the node NA can be prevented.

Moreover, the semiconductor integrated circuit 7 is capable of preventing chattering from occurring in the node NA voltage, thus stabilizing the operation of the operation amplifier 50.

8. Eighth Embodiment

A semiconductor integrated circuit according to an eighth embodiment will be described below. The semiconductor integrated circuit according to the eighth embodiment includes an operation amplifier, similarly to the seventh embodiment. The eighth embodiment is an example in which the hysteresis circuit 13 is changed to the hysteresis circuit 14 in the semiconductor integrated circuit 7 of the seventh embodiment shown in FIG. 14. In other words, in this example, a configuration of the operation amplifier is added to the control circuit 10_2 of the semiconductor integrated circuit 2 of the second embodiment. The other configurations are similar to that of the second or seventh embodiment described above. In the eighth embodiment, mainly differences from the second or seventh embodiment will be described.

8.1 Configuration of Eighth Embodiment

FIG. 15 is a circuit diagram showing a configuration of a semiconductor integrated circuit 8 according to the eighth embodiment. The semiconductor integrated circuit 8 includes the control circuit 10_2 and the operation amplifier 50. The control circuit 10_2 controls the operation amplifier 50 to be switched between the operating state and the non-operating state, according to the control voltage VCT. The circuit configuration of the control circuit 10_2 is similar to that of the second embodiment. The operation amplifier 50 includes the first gain circuit 51 and the output circuit 52. The circuit configuration of the operation amplifier 50 is similar to that of the seventh embodiment.

8.2 Operation of Eighth Embodiment

An operation of the semiconductor integrated circuit 8 according to the eighth embodiment will be described below. The operation of the semiconductor integrated circuit 8 is similar to that of the seventh embodiment in any of the cases where the control voltage VCT is "L", where the control voltage VCT is "H", and where the control voltage VCT transitions from "L" to "H" or from "H" to "L".

The operation of the hysteresis circuit 14 in the semiconductor integrated circuit 8 is similar to that of the hysteresis circuit 14 in the second embodiment.

8.3 Advantageous Effects of Eighth Embodiment

According to the eighth embodiment, it is possible to provide the semiconductor integrated circuit including the operation amplifier equipped with the through current prevention function and capable of reducing power consumption.

The semiconductor integrated circuit 8 of the eighth embodiment produces advantageous effects to be described below, similarly to the first embodiment.

The first advantage is that the through current can be prevented. The second advantage is that the consumption current (i.e., the power consumption) can be reduced. The third advantage is that an output of the unstable voltage from the node NA can be prevented.

Moreover, the semiconductor integrated circuit 8 is capable of preventing chattering from occurring in the node NA voltage, thus stabilizing the operation of the operation amplifier 50.

9. Ninth Embodiment

A semiconductor integrated circuit according to a ninth embodiment will be described below. The semiconductor integrated circuit according to the ninth embodiment includes an operation amplifier, similarly to the seventh and eighth embodiments. The ninth embodiment is an example in which the hysteresis circuit 13 is changed to the hysteresis circuit 15 in the semiconductor integrated circuit 7 of the seventh embodiment shown in FIG. 14. In other words, in this example, a configuration of the operation amplifier is added to the control circuit 10_3 of the semiconductor integrated circuit 3 of the third embodiment. The other configurations are similar to that of the third or seventh embodiment described above. In the ninth embodiment, mainly differences from the third or seventh embodiment will be described.

9.1 Configuration of Ninth Embodiment

FIG. 16 is a circuit diagram showing a configuration of a semiconductor integrated circuit 9 according to the ninth embodiment. The semiconductor integrated circuit 9 includes the control circuit 10_3 and the operation amplifier 50. The control circuit 10_3 controls the operation amplifier 50 to be switched between the operating state and the non-operating state, according to the control voltage VCT. The circuit configuration of the control circuit 10_3 is similar to that of the third embodiment. The operation amplifier 50 includes the first gain circuit 51 and the output circuit 52. The circuit configuration of the operation amplifier 50 is similar to that of the seventh embodiment.

9.2 Operation of Ninth Embodiment

An operation of the semiconductor integrated circuit 9 according to the ninth embodiment will be described below. The operation of the semiconductor integrated circuit 9 is similar to that of the seventh embodiment in any of the cases where the control voltage VCT is "L", where the control voltage VCT is "H", and where the control voltage VCT transitions from "L" to "H" or from "H" to "L".

The operation of the hysteresis circuit 15 in the semiconductor integrated circuit 9 is similar to that of the hysteresis circuit 15 in the third embodiment.

9.3 Advantageous Effects of Ninth Embodiment

According to the ninth embodiment, it is possible to provide the semiconductor integrated circuit including the operation amplifier equipped with the through current prevention function and capable of reducing power consumption.

The semiconductor integrated circuit 9 of the ninth embodiment produces advantageous effects to be described below, similarly to the first embodiment.

The first advantage is that the through current can be prevented. The second advantage is that the consumption current (i.e., the power consumption) can be reduced. The third advantage is that an output of the unstable voltage from the node NA can be prevented.

Moreover, the semiconductor integrated circuit 9 is capable of preventing chattering from occurring in the node NA voltage, thus stabilizing the operation of the operation amplifier 50.

10. OTHER MODIFICATIONS, ETC

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a p-channel first transistor, a source of the first transistor being electrically coupled to a first voltage node to which a first voltage is supplied, a gate of the first transistor being electrically coupled to a second voltage node to which a second voltage is supplied;
an n-channel second transistor, a source of the second transistor being electrically coupled to a third voltage node to which a third voltage is supplied, a gate of the second transistor being electrically coupled to the second voltage node;
a depletion-type n-channel third transistor electrically coupled between a drain of the first transistor and a drain of the second transistor;
a p-channel fourth transistor, a source of the fourth transistor being electrically coupled to the first voltage node, a gate of the fourth transistor being electrically coupled to a first output node located between the drain of the second transistor and a source of the third transistor;
an n-channel fifth transistor, a source of the fifth transistor being electrically coupled to the third voltage node, a gate of the fifth transistor being electrically coupled to the gate of the fourth transistor, a drain of the fifth transistor being electrically coupled to a drain of the fourth transistor;
a p-channel sixth transistor, a gate of the sixth transistor being supplied with a voltage output from a second output node located between the drain of the fourth transistor and the drain of the fifth transistor, a source of the sixth transistor being electrically coupled to the first voltage node; and
a hysteresis circuit configured to reduce vibration that occurs in a voltage of the first output node, the hysteresis circuit being electrically coupled to the first output node.

2. The semiconductor integrated circuit according to claim 1, wherein
the hysteresis circuit includes:
an n-channel seventh transistor, a drain of the seventh transistor being electrically coupled to the first output node, a gate of the seventh transistor being electrically coupled to the second voltage node; and
an n-channel eighth transistor, a drain of the eighth transistor being electrically coupled to a source of the seventh transistor, a gate of the eighth transistor being electrically coupled to the second output node, a source of the eighth transistor being electrically coupled to the third voltage node.

3. The semiconductor integrated circuit according to claim 1, wherein
the hysteresis circuit includes:
a depletion-type n-channel seventh transistor, a source and a gate of the seventh transistor being electrically coupled to the first output node; and
a p-channel eighth transistor, a drain of the eighth transistor being electrically coupled to a drain of the seventh transistor, a gate of the eighth transistor being electrically coupled to the second output node, a source of the eighth transistor being electrically coupled to the first voltage node.

4. The semiconductor integrated circuit according to claim 1, wherein
the hysteresis circuit includes:
an n-channel seventh transistor, a drain of the seventh transistor being electrically coupled to the first output node, a gate of the seventh transistor being electrically coupled to the second output node; and
a depletion-type n-channel eighth transistor, a drain of the eighth transistor being electrically coupled to a source of the seventh transistor, a gate and a source of the eighth transistor being electrically coupled to the third voltage node.

5. The semiconductor integrated circuit according to claim 1, further comprising an inversion logic circuit coupled between the second output node and the gate of the sixth transistor.

6. The semiconductor integrated circuit according to claim 1, further comprising a non-inversion logic circuit coupled between the second output node and the gate of the sixth transistor.

7. The semiconductor integrated circuit according to claim 1, further comprising:
a first circuit configured to output a first output voltage according to a voltage difference between a feedback voltage and a reference voltage to the gate of the sixth transistor, the first circuit including a p-channel ninth transistor, a gate of the ninth transistor being supplied with a voltage output from the second output node, a drain of the ninth transistor being electrically coupled to the gate of the sixth transistor, a source of the ninth transistor being electrically coupled to the first voltage node; and
a feedback circuit configured to output the feedback voltage obtained by dividing a second output voltage using a plurality of resistances, the feedback circuit including the resistances coupled in series between a drain of the sixth transistor and the third voltage node.

8. The semiconductor integrated circuit according to claim 1, further comprising:
a first circuit configured to output a first output voltage that is amplified according to a voltage difference between a first input voltage and a second input voltage to the gate of the sixth transistor, the first circuit including a p-channel ninth transistor, a gate of the ninth transistor being supplied with a voltage output from the second output node, a drain of the ninth transistor being electrically coupled to the gate of the sixth transistor, a source of the ninth transistor being electrically coupled to the first voltage node;
a constant current source, an input terminal of the constant current source being coupled to a drain of the sixth transistor; and
an n-channel tenth transistor coupled between an output terminal of the constant current source and the third voltage node.

9. The semiconductor integrated circuit according to claim 7, wherein
the first circuit comprises:
an n-channel tenth transistor, a gate of the tenth transistor being supplied with the feedback voltage;
a p-channel eleventh transistor, a gate and a drain of the eleventh transistor being electrically coupled to a drain of the tenth transistor, a source of the eleventh transistor being electrically coupled to the first voltage node;
an n-channel twelfth transistor, a gate of the twelfth transistor being supplied with the reference voltage;
a p-channel thirteenth transistor, a drain of the thirteenth transistor being electrically coupled to a drain of the twelfth transistor, a gate of the thirteenth transistor being electrically coupled to the gate of the eleventh transistor, a source of the thirteenth transistor being electrically coupled to the first voltage node;
a constant current source, an input terminal of the constant current source being coupled to a source of the tenth transistor and a source of the twelfth transistor;
an n-channel fourteenth transistor coupled between an output terminal of the constant current source and the third voltage node, a gate of the fourteenth transistor being supplied with a voltage output from the second output node;
a constant voltage source configured to supply the reference voltage to the gate of the twelfth transistor; and
an n-channel fifteenth transistor coupled between the constant voltage source and the third voltage node, a gate of the fifteenth transistor being supplied with a voltage output from the second output node, wherein
the first output voltage is output from a node located between the drain of the twelfth transistor and the drain of the thirteenth transistor.

10. The semiconductor integrated circuit according to claim 8, wherein
the first circuit comprises:
an n-channel eleventh transistor, a gate of the eleventh transistor being supplied with the first input voltage;
a p-channel twelfth transistor, a gate and a drain of the twelfth transistor being electrically coupled to a drain of the eleventh transistor, a source of the twelfth transistor being electrically coupled to the first voltage node;
an n-channel thirteenth transistor, a gate of the thirteenth transistor being supplied with the second input voltage;
a p-channel fourteenth transistor, a drain of the fourteenth transistor being electrically coupled to a drain of the thirteenth transistor, a gate of the fourteenth transistor being electrically coupled to the gate of the twelfth transistor, a source of the fourteenth transistor being electrically coupled to the first voltage node;

a constant current source, an input terminal of the constant current source being coupled to a source of the eleventh transistor and a source of the thirteenth transistor; and an n-channel fifteenth transistor coupled between an output terminal of the constant current source and the third voltage node, a gate of the fifteenth transistor being supplied with a voltage output from the second output node, wherein the first output voltage is output from a node located between the drain of the thirteenth transistor and the drain of the fourteenth transistor.

11. A semiconductor integrated circuit comprising:

a p-channel first transistor, a source of the first transistor being electrically coupled to a first voltage node to which a first voltage is supplied, a gate of the first transistor being electrically coupled to a second voltage node to which a second voltage is supplied;

an n-channel second transistor, a source of the second transistor being electrically coupled to a third voltage node to which a third voltage is supplied, a gate of the second transistor being electrically coupled to the second voltage node;

a depletion-type n-channel third transistor electrically coupled between a drain of the first transistor and a drain of the second transistor;

a p-channel fourth transistor, a source of the fourth transistor being electrically coupled to the first voltage node, a gate of the fourth transistor being electrically coupled to a first output node located between the drain of the second transistor and a source of the third transistor;

an n-channel fifth transistor, a source of the fifth transistor being electrically coupled to the third voltage node, a gate of the fifth transistor being electrically coupled to the gate of the fourth transistor, a drain of the fifth transistor being electrically coupled to a drain of the fourth transistor;

a first circuit configured to output a second output voltage that is one of the first voltage and a first output voltage according to a voltage difference between a feedback voltage and a reference voltage, the first circuit including a p-channel sixth transistor, a gate of the sixth transistor being supplied with a voltage output from a second output node located between the drain of the fourth transistor and the drain of the fifth transistor, a source of the sixth transistor being electrically coupled to the first voltage node, the second output voltage is output from a drain of the sixth transistor; and an output circuit configured to output a third output voltage according to the second output voltage and output the feedback voltage obtained by dividing the third output voltage.

12. The semiconductor integrated circuit according to claim 11, further comprising a hysteresis circuit configured to reduce vibration that occurs in a voltage of the first output node, the hysteresis circuit being electrically coupled to the first output node.

13. The semiconductor integrated circuit according to claim 12, wherein the hysteresis circuit includes:

an n-channel seventh transistor, a drain of the seventh transistor being electrically coupled to the first output node, a gate of the seventh transistor being electrically coupled to the second voltage node; and an n-channel eighth transistor, a drain of the eighth transistor being electrically coupled to a source of the seventh transistor, a gate of the eighth transistor being electrically coupled to the second output node, a source of the eighth transistor being electrically coupled to the third voltage node.

14. The semiconductor integrated circuit according to claim 12, wherein the hysteresis circuit includes:

a depletion-type n-channel seventh transistor, a source and a gate of the seventh transistor being electrically coupled to the first output node; and a p-channel eighth transistor, a drain of the eighth transistor being electrically coupled to a drain of the seventh transistor, a gate of the eighth transistor being electrically coupled to the second output node, a source of the eighth transistor being electrically coupled to the first voltage node.

15. The semiconductor integrated circuit according to claim 11, wherein the first circuit comprises:

a ninth transistor, a gate of the ninth transistor being supplied with the feedback voltage;

a tenth transistor, a gate and a drain of the tenth transistor being electrically coupled to a drain of the ninth transistor;

an eleventh transistor, a gate of the eleventh transistor being supplied with the reference voltage; and a twelfth transistor, a drain of the twelfth transistor being electrically coupled to a drain of the eleventh transistor, wherein the first output voltage is output from the drain of the eleventh transistor.

16. A semiconductor integrated circuit comprising:

a p-channel first transistor, a source of the first transistor being electrically coupled to a first voltage node to which a first voltage is supplied, a gate of the first transistor being electrically coupled to a second voltage node to which a second voltage is supplied;

an n-channel second transistor, a source of the second transistor being electrically coupled to a third voltage node to which a third voltage is supplied, a gate of the second transistor being electrically coupled to the second voltage node;

a depletion-type n-channel third transistor electrically coupled between a drain of the first transistor and a drain of the second transistor;

a p-channel fourth transistor, a source of the fourth transistor being electrically coupled to the first voltage node, a gate of the fourth transistor being electrically coupled to a first output node located between the drain of the second transistor and a source of the third transistor;

an n-channel fifth transistor, a source of the fifth transistor being electrically coupled to the third voltage node, a gate of the fifth transistor being electrically coupled to the gate of the fourth transistor, a drain of the fifth transistor being electrically coupled to a drain of the fourth transistor;

a first circuit configured to output a second output voltage that is one of the first voltage and a first output voltage amplified according to a voltage difference between a first input voltage and a second input voltage, the first circuit including a p-channel sixth transistor, a gate of the sixth transistor being supplied with a voltage output from a second output node located between the drain of the fourth transistor and the drain of the fifth transistor, a source of the sixth transistor being electrically coupled to the first voltage node, the second output voltage is output from a drain of the sixth transistor; and an output circuit configured to output a third output voltage according to the second output voltage.

17. The semiconductor integrated circuit according to claim 16, further comprising a hysteresis circuit configured to reduce vibration that occurs in a voltage of the first output node, the hysteresis circuit being electrically coupled to the first output node.

18. The semiconductor integrated circuit according to claim 17, wherein the hysteresis circuit includes:

an n-channel seventh transistor, a drain of the seventh transistor being electrically coupled to the first output node, a gate of the seventh transistor being electrically coupled to the second voltage node; and an n-channel eighth transistor, a drain of the eighth transistor being electrically coupled to a source of the seventh transistor, a gate of the eighth transistor being electrically coupled to the second output node, a source of the eighth transistor being electrically coupled to the third voltage node.

19. The semiconductor integrated circuit according to claim 17, wherein the hysteresis circuit includes:

a depletion-type n-channel seventh transistor, a source and a gate of the seventh transistor being electrically coupled to the first output node; and a p-channel eighth transistor, a drain of the eighth transistor being electrically coupled to a drain of the seventh transistor, a gate of the eighth transistor being electrically coupled to the second output node, a source of the eighth transistor being electrically coupled to the first voltage node.

* * * * *